(12) United States Patent
Zakeeruddin et al.

(10) Patent No.: US 8,847,065 B2
(45) Date of Patent: Sep. 30, 2014

(54) MODIFIED SURFACE

(75) Inventors: Shaik Mohammad Zakeeruddin, Bussigny-Lausanne (CH); Péter Péchy, Lausanne (CH); Michael Graetzel, St-Sulpice (CH)

(73) Assignee: Ecole Polytechnique Federale de Lausanne (EPFL), Lausanne (CH)

( * ) Notice: Subject to any disclaimer, the term of this patent is extended or adjusted under 35 U.S.C. 154(b) by 304 days.

(21) Appl. No.: 13/138,665

(22) PCT Filed: Mar. 19, 2010

(86) PCT No.: PCT/IB2010/051211
§ 371 (c)(1),
(2), (4) Date: Sep. 16, 2011

(87) PCT Pub. No.: WO2010/106528
PCT Pub. Date: Sep. 23, 2010

(65) Prior Publication Data
US 2012/0010411 A1    Jan. 12, 2012

(30) Foreign Application Priority Data
Mar. 19, 2009 (EP) .................................... 09155639

(51) Int. Cl.
*H01L 31/042* (2014.01)
*C07F 9/30* (2006.01)

(52) U.S. Cl.
USPC ............................................ 136/252; 556/20

(58) Field of Classification Search
USPC ................... 556/19, 20; 558/207; 136/252
See application file for complete search history.

(56) References Cited

U.S. PATENT DOCUMENTS

2007/0240756 A1   10/2007   Lee et al.

FOREIGN PATENT DOCUMENTS

WO   WO 2004/097871   11/2004

OTHER PUBLICATIONS

Gawalt, E. et al.: Bonding organics to Ti alloys: Facilitating human osteoblast attachment and spreading on surgical implant material. Langmuir, vol. 19, pp. 200-204, 2003.*
Gawalt, E. et al.: Enhanced bonding of alkanephosphonic acids to oxidized titanium using surface bound alkoxyzirconium complex interfaces. Langmuir, vol. 15, pp. 8929-8933, 1999.*
Oberoi, S. et al.: Syntrhesis of specially designed adhesion promotor for grafting polypyrrole. Macromol. Symp., vol. 254, pp. 284-291, 2007.*
Wang, M. et al.: Passivation of nanocrystalline TiO2 junctions by surface adsorbed phosphinate amphiphiles enhances the photovoltaic performance of dye sensitized solar cells. Dalton Trans. pp. 10015-10020, 2009.*
International Search Report; PCT/IB2010/051211 , mailed Jul. 22, 2010.
Guerrero et al., Anchoring of phosphonate and phosphinate coupling molecules on titania particles, Chem. Mater. 13, 2001, 4367-4373.
Mutin et al., Organic-inorganic hybrid materials based on organophosphorus coupling molecules: from metal phosphonates to surface modifications of oxides, C.R. Chimie 6, 2033, 1153-1164.
Mingalyov and Lisichkin, Chemical modification of oxide surfaces with organophosphorus (V) acids and their esters, Russian Chemical Reviews 75(6) , 2006, 541-557.
O'Regan and Graetzel, A low-cost, high-efficiency solar cell based on dye-sensitized colloidal TiO2 films, Nature 353, 1991, 737-740.

* cited by examiner

*Primary Examiner* — Charanjit Aulakh
(74) *Attorney, Agent, or Firm* — Krieg DeVault LLP; Brad A. Schepers

(57) ABSTRACT

The present invention relates to modified surfaces. The surfaces comprise an inorganic material on which a phosphinic acid derivative is adsorbed. The phosphinic acid thus turns out to be a new anchoring group useful for surface derivatization. The invention has many applications for photoelectric conversion devices, batteries, capacitors, electrochromic displays, chemical sensors, biological sensors, light emitting diodes, electrodes, semiconductors, separation membranes, selective adsorbents, adsorbents for HPLC, catalysts, implants, nanoparticles, antiadhesives, and anticorrosion coatings, for example.

8 Claims, 11 Drawing Sheets

(52)

(53)

MODIFIED SURFACE

This application claims the benefits under 35 U.S.C. 119 (a)-(d) or (b), or 365(b) of International Application No. PCT/IB2010/05051211 filed 3 Mar. 2010, and European Patent Application No. 09155639.9, filed 19 Mar. 2009.

TECHNICAL FIELD

The present invention relates to a modified surface, to a device or a structural unit of a device comprising a modified surface, to dye-sensitized solar cells and to phosphinic acid derivatives for modifying surfaces.

PRIOR ART AND THE PROBLEM UNDERLYING THE INVENTION

The modification of metal and mineral surfaces has attracted increased interest in the last decade. Furthermore, an increasing number of applications are concerned. The surface of implants, for example, is modified in order to prevent rejection of the implant by a patient's immune system. Many materials are surface-modified in order to obtain desired catalytic properties. Electrode materials are modified in order to adjust the charge transfer properties at interfaces. The list could be prolonged arbitrarily while addressing different and even completely unrelated technology fields.

The state in the art of the chemical modification of inorganic surfaces by organophosphorus acids has been reviewed by G. Guerrero et al. in Chemical Material (2001), 13, 4367-4373, P. H. Mutin in Elsevier C. R. Chimie 6 (2003) 1153-1164 and, more recently, by P. G. Mingalyov et al. in the Russian Chemical Reviews 75(6) 541-557 (2006). From these reviews it appears that phosphonic acids, for example alkyl phosphonic acids and halogenated forms thereof have been reported for the modification of surfaces. However, very little has been done with other organophosphorous compounds, in particular the case of two different functional ligands, namely organic, such as compacting or co-adsorbent molecule, and organometallic substituents, such as dye, are bound to the phosphorus atom of the phosphinic acid. US 2007/240756 describes organic dyes comprising an acid functional group such as carboxyl enabling the anchoring of one dye molecule or light absorbing entity.

In view of the above, it is a general objective of the present invention to provide new ways and/or compounds for modifying inorganic surfaces, for example mineral and metal surfaces.

More specifically, it is an objective to provide new organophosphorus compounds for modifying surfaces, and in particular providing further possibilities and/or variability of surface modification than previously reported compounds.

As indicated above, one particular field of interest is the modification of electrodes for various purposes. For example, photoanodes of photoelectric conversion devices can be modified. One specific example where surface modification is particularly relevant is the dye-sensitized solar cell. This type of solar cell has become a viable alternative to silicon based devices since Prof. Grätzel et al. have used electrochemical cells in which a sensitizing dye is adsorbed on a porous photoanode surface based on crystalline $TiO_2$ nanoparticles (B. O'Regan and M. Graetzel, Nature 1991, 353, 737). In these devices, sensitizing dyes, for example polypyridyl ruthenium complexes, are adsorbed by way of an anchoring group on the $TiO_2$ surface. In WO2004/097871, compounds that do not function as light absorbents, but which assist in the formation of a dense monolayer are disclosed. These compounds are thus referred to as compacting compounds and are believed to form, together with corresponding portion of the dye molecules, a dense hydrophobic level within the monolayer, hindering the access of polar species present in the electrolyte to the surface of the semiconductor metal oxide layer. In this way, some stability problems, such as the corrosion of the photoelectrode by the triiodide/iodide redox couple used in the electrolyte of these devices, can be reduced. Typical anchoring groups for sensitizing dyes or co-adsorbed compounds are $COOH$, $PO_3H_2$, $PO_4H_2$, $SO_3H_2$, $SO_4H_2$, $CONHOH^-$ and deprotonated forms of these.

In view of the above it is an objective of the present invention to provide new ways of attaching sensitizing dyes or ancillary compounds such as compacting molecules and co-adsorbent molecules to electrode and/or conductor surfaces. In particular, it is an objective to provide new, alternative anchoring groups providing a stable attachment of a respective compound on the surface or an equally strong binding of same or different functional entity ligand of the compound according to the invention.

It is also an objective to provide a way of anchoring one or more, possibly different functionalities by way of a single anchoring group. It is also an objective to provide a way of producing still denser layers of surface modifiers, in particular denser monolayers of adsorbed compounds.

In more general terms, it is an objective to provide further possibilities of variation and combination when modifying surfaces, in particular electrode and/or semiconductor surfaces.

The present invention addresses the problems and objectives depicted above.

SUMMARY OF INVENTION

Remarkably, the present inventors successfully modified surfaces of choice with phosphinic acid and phosphinate derivatives. Interestingly, many different types of inorganic surfaces, including metal and mineral surfaces can be modified by way of the derivatives. Since the phosphinic acid group provides the possibility of attaching two substituents, which are either organic or organometallic or both to the same phosphorus atom, the present invention provides the possibility of further combinations and variations with respect to surface modification.

Accordingly, the present invention provides, in an aspect, the use of phosphinic acid or phosphinate and its derivatives as an anchoring group for anchoring molecules to inorganic surfaces.

In another aspect, the present invention provides an inorganic surface modified by a layer of phosphinic acid and/or phosphinate derivatives adsorbed on the inorganic surface.

In an aspect, the present invention provides a modified surface comprising a surface comprising an inorganic material, wherein an organic and/or organometallic compound is bound to the material and thereby modifies the surface to provide the modified surface, wherein said compound is a phosphinic acid compound according to formula (1) below:

(1)

wherein $R_1$ and $R_2$ are selected, independently, from H, an organic substituent and from an organometallic substituent, provided that at least one of $R_1$ and $R_2$ is not H.

In a further aspect, the present invention provides a device or device structure comprising the modified surface according to the invention.

Further aspects and preferred embodiments of the present invention are provided in the appended claims and the detailed description herein below.

BRIEF DESCRIPTION OF THE DRAWINGS

FIG. 11(a) Current-voltage characteristics of different devices under AM1.5 illumination: device C, the $TiO_2$ sensitized with Z907Na; device D, the $TiO_2$ co-sensitized with Z907Na/DINHOP (molar ratio 1:1). The electrolyte composition is as follows: 1.0 M PMII, 0.15 M $I_2$, 0.5 M NBB, and 0.1 M GNCS in MPN. FIG. 11(b) Photovoltaic parameters of devices A and B during successive full sun visible-light soaking test up 1,000 h at 60° C.

DETAILED DESCRIPTION OF THE PREFERRED EMBODIMENTS

Figure 1:
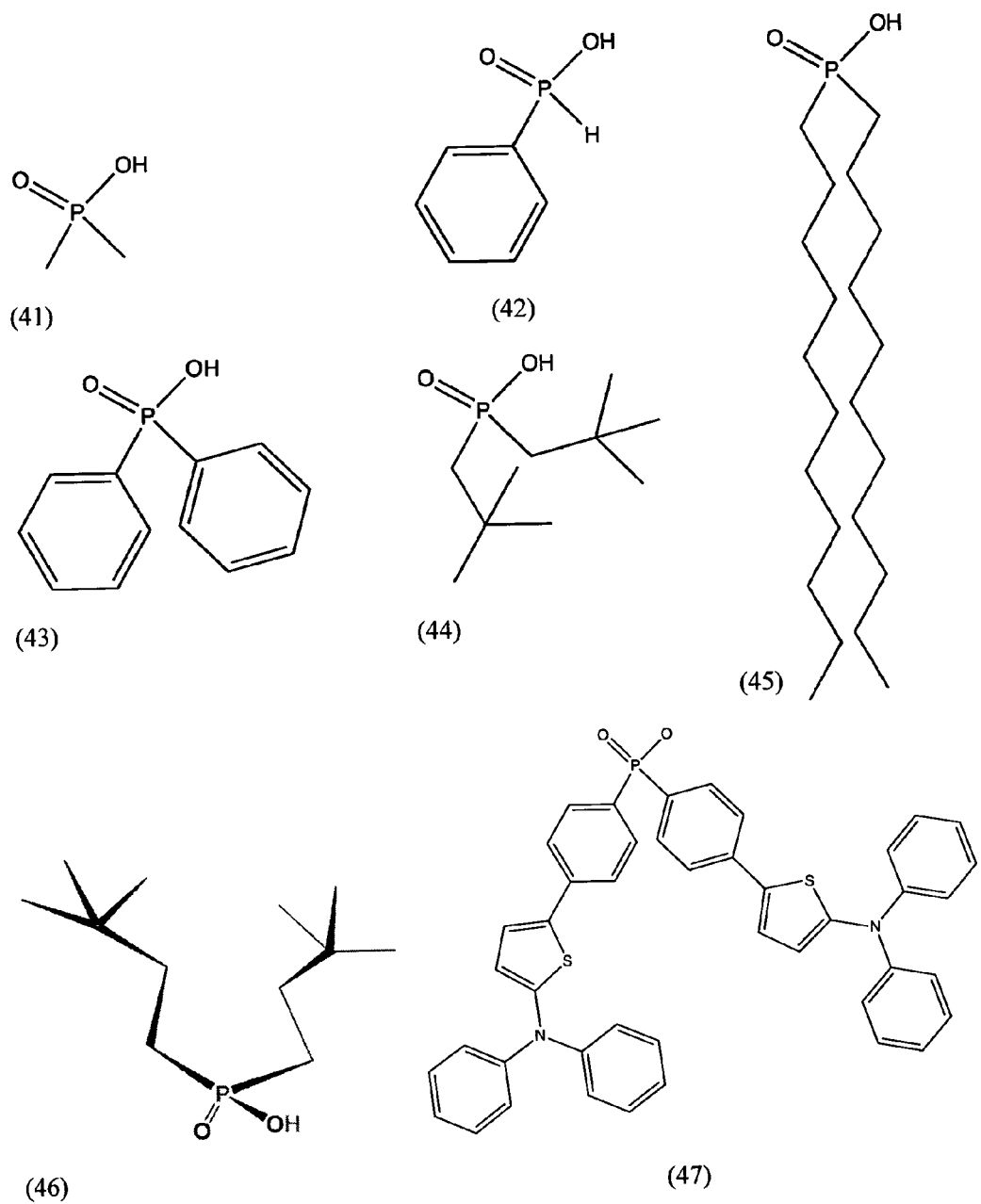
FIG. 1 shows exemplary compounds of the invention useful in the preparation of modified surfaces according to the invention. Compounds (41)-(46) may be used as compacting compounds on photoelectrodes of solar cells, such as DSCs (dye-sensitized solar cells), and compound (47) can be used as an organic sensitizer dye in such cells.
Figure 2:
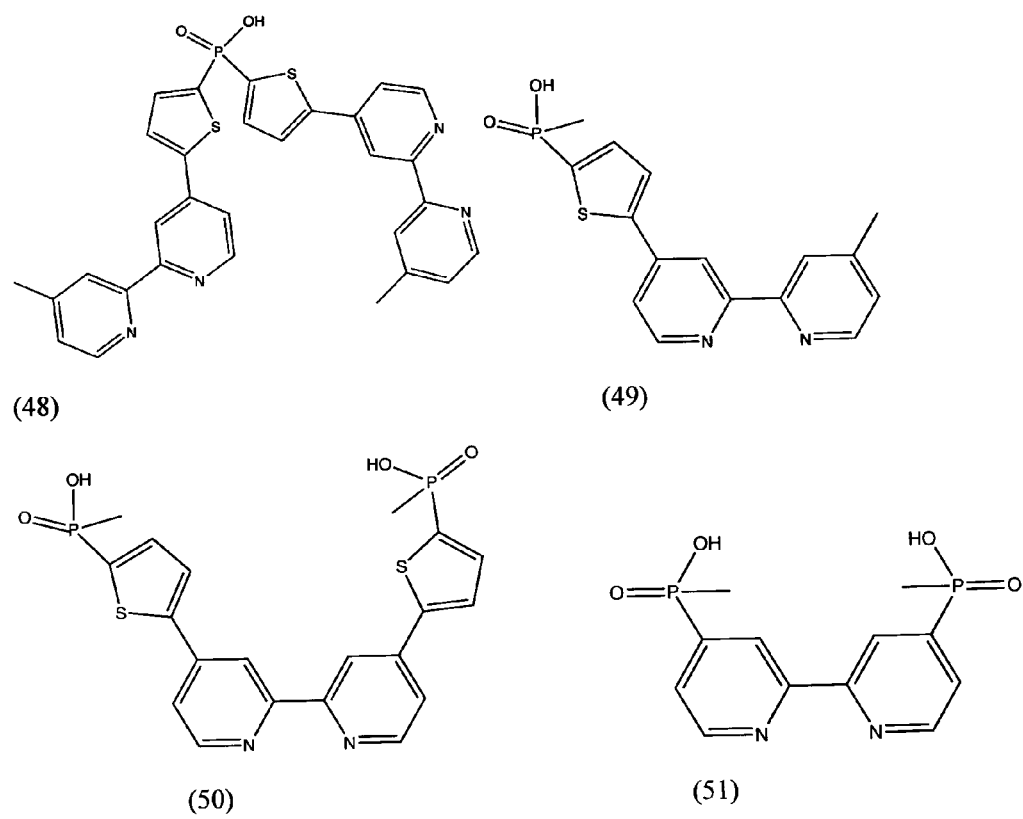
FIG. 2 shows exemplary compounds of the invention useful in the preparation of modified surfaces according to the invention. The compounds (48)-(51) all comprise at least one bipyridine structure, which makes these compounds useful as anchoring ligands in sensitizer dyes of DSCs.

The present invention relates to inorganic surfaces that are modified by way of phosphinic acid and/or phosphinate derivatives, in particular those of formula (1). The invention also relates to devices or device structures comprising such surfaces. Phosphinic acid is a synonym for the term hypophosphoric acid $HOP(O)H_2$. The two hydrogen atoms directly bound to the phosphorous atom may be substituted, for example by organic and/or organometallic substituents as in order to provide desired properties and characteristics.

An inorganic surface according to the invention may be, for example, a metal surface, a mineral surface, an oxide surface, a sulphide surface, phosphate surface, silicate surface for example. There are surfaces that fall under the definition of two or more of the aforementioned. For example, many minerals are metal oxides or metal sulphides, which are preferred surface materials according to the invention. The invention also encompasses surfaces that comprise the inorganic materials mentioned in this specification as a constitutional part, including material mixtures, for example doped materials, and the like. Materials that are a mixture of different inorganic materials or of inorganic and organic materials are also encompassed by the invention.

In the surface of the present invention, the phosphorous atom of the phosphinic acid anchoring group preferably has, when linked to the surface of the inorganic material as defined herein, an oxidation state from −3 to +5 (including the values −3 and +5). These oxidation states apply in particular between a metal atom and the phosphorous atom.

According to an embodiment, said inorganic material comprises a material selected from silica, mica, metal, metal alloy, metal oxide, and metal sulfide.

According to a preferred embodiment of the invention, said inorganic material comprises a material selected from aluminium, titanium, zirconium, iron, tin, gold, silver, copper, brass, cobalt, niobium, vanadium, tantalum and chromium, including any oxides and/or sulfides of the aforementioned materials. For example, the surface may comprise or substantially consist of aluminia, titania and/or zirconia.

Specific examples of materials that may form part of the surface of the invention or that may form one of several constitutional elements of it are the chemical formula: $Ag_2O$, $AlTiO_3$, $BaTiO_3$, $BiO_3$, $CdO$, $CdFe_2O_4$, $Ce_2O_3$, $CuO$, $Cu_2O$, $CuTiO_3$, $FeO$, $Fe_2O_3$, $Fe_3O4$, $FeOOH$, $FeTiO_3$, $Ga_2O_3$, $Hgo$, $Hg_2Nb_2O_7$, $Hg_2Ta_2O_7$, $In_2O_3$, $KNbO_3$, $KTaO_3$, $La_2O_3$, $LaTi_2O_7$, $LiNbO_3$, $LiTaO_3$, $MgTiO_3$, $MnO$, $MnO_2$, $MnTiO_3$, $Nb_2O_5$, $Nd_2O_3$, $NiO$, $NiTiO_3$, $PbO$, $PbFe_{12}O_{19}$, $PdO$, $Pr_2O_3$, $Sb_2O_3$, $Sm_2O_3$, $SnO$, $SnO_2$, $SrTiO_3$, $Ta_2O_5$, $Tb_2O_3$, $TiO_2$, $Tl_2O_3$, $V_2O_5$, $WO_3$, $Yb_2O_3$, $YFeO_3$, $ZnO$, $ZnTiO_3$, $ZrO_2$, $Ag_2S$, $AgAsS_2$, $AgSbS_2$, $As_2S_3$, $CdS$, $Ce_2S_3$, $CoS$, $CoS_2$, $CoAsS$, $CuS$, $Cu_2S$, $CuS_2$, $Cu_3AsS_4$, $CuFeS_2$, $Cu_5FeS_4$, $CuInS_2$, $CuIn_5S_8$, $Dy_2S_3$, $FeS$, $FeS_2$, $Fe_3S_4$, $FeAsS$, $Gd_2S_3$, $HfS_2$, $HgS$, $HgSb_4S_8$, $In_2S_3$, $La_2S_3$, $MnS$, $MnS_2$, $MoS_2$, $Nd_2S_3$, $NiS$, $NiS_2$, $OsS_2$, $PbS$, $Pb_{10}Ag_3$, $Sb_{11}S_{28}$, $Pb_2As_2S_5$, $PbCuSbS_3$, $Pb_5Sn_3Sb_2S_{14}$, $Pr_2S_3$, $PtS_2$, $Rh_2S_3$, $RuS_2$, $Sb_2S_3$, $Sm_2S_3$, $SnS$, $SnS_2$, $Tb_2S_3$, $TiS_2$, $TlAsS_2$, $WS_2$, $ZnS$, $ZnS_2$, $Zn_3In_2S_6$, $ZrS_2$. These materials are preferably provided as crystalline solids or amorphous solids in surfaces according to the invention.

The inorganic material may form a smooth or a porous surface. For example, it may be a mesoporous surface.

The surface of the invention forms the device or a part of the device of the present invention. Non-limiting examples of devices or device structures for the purpose of the invention are photoelectric conversion devices, batteries, capacitors, electrochromic displays, chemical and/or biological sensors, light emitting diodes, electrodes, semiconductors, separation membranes, selective adsorbents, adsorbents for HPLC, catalysts, implants, nanoparticles, antiadhesives, anticorrosion coatings, or of any combination of the aforementioned. As the skilled person will note, some of the devices or device parts of the invention as provided above have overlapping definitions or function as a part of a device. For example, electrodes may comprise semiconductor materials, photoelectric conversion devices comprise semiconductor materials, and generally also electrodes, but an electrode may also be an electrode of a battery, for example.

According to an aspect, the present invention relates to an electrode comprising a modified surface according to the invention. The electrode may be a cathode or an anode. For example, the electrode may be a photoelectrode, for example a photoanode of a photoelectric conversion device, such as a solar cell. The electrode may be made from a conductor and/or a semiconductor material.

According to an aspect, the present invention relates to a semiconductor material comprising a surface according to the invention.

According to an embodiment, the inorganic material of the surface of the invention may comprises metal chalcogenides, in particular oxides of titanium, tin, zinc, iron, tungsten, zirconium, hafnium, strontium, indium, cerium, yttrium, lanthanum, vanadium, niobium, and tantalum, sulfides of cadmium, zinc, lead, silver, antimony and bismuth, selenides of cadmium and lead, and cadmium telluride. The other compound semiconductors include phosphides of zinc, gallium, indium and cadmium, selenides of gallium-arsenic and copper-indium, and copper-indium sulfide.

An example of device according to the invention comprises an implant comprising a surface according to the invention. For example, the present invention relates to a dental implant comprising a modified surface. Dental implant may be made, for example, from materials such as pure titanium; titanium comprising impurities, such as oxygen, carbon and/or iron; titanium alloys, such as titanium aluminium alloys, for example.

According to another example, the present invention relates to a bone implant. Bone implant include intra-bone (endosseous) implants, which are used to as prostheses in medicine for replacing or strengthening broken bones or as artificial teeth. Bone implants may be made from titanium, titanium alloy or any other metal or alloy which is known to be used for the production of bone implants, such as chromium, niobium, tantalum, vanadium, zirconium, aluminium, cobalt, stainless steels or alloys thereof. The literature discloses such metals and metal alloys for making implants.

The implant comprising a surface according to the invention may also be made from a ceramic. Such ceramic surfaces may be metallic surfaces, which have been treated thermally or chemically or treated with a plasma or have been treated otherwise to become an oxide surface. The surface may have been treated accordingly (thermally, chemically or plasma) to become a carbide surface or nitride surface, for example a titanium surface, which has been treated to become a titanium carbide or a titanium nitride surface or a titanium oxynitride or a titanium carbonitride or a titanium oxycarbide. Other ceramic surfaces, which may be used within the scope of the present invention may be made from metal oxides, for example from aluminium oxide, zirconium oxide or silicon oxide, from apatites, preferably hydroxyapatite or fluorapatite, or apatite like layers, preferably tricalciumphosphate, or brushite. Other ceramic surfaces which may be used within the scope of the invention may be selected from glass-like surfaces made for example from silicate glass, or bioglass. Further materials that can be used are mentioned in WO2002/40073, which also relates to surfaces of implants, and which is entirely incorporated herein by reference. The materials mentioned in this and the above two paragraph may be used for the purpose of the invention in general, in all applicable applications mentioned further above, not only in implants.

Implants may be in the form of screws, plates, nails, pins, and specially formed parts and may be used as prostheses. These materials may be modified by adsorption of a compound of formula (1) as defined herein, in order to provide a surface having modified properties.

According to an embodiment of the invention, the present invention provides a surface of an anode and/or of a cathode of a battery, the surface being modified according to the present invention. Preferably, the battery is a lithium battery. Electrode materials of batteries according to the present invention are, for example, disclosed in US2007/0281215, which is entirely incorporated herein by reference. Such materials may be of the general formula $LiMPO_4$, where M is one or more first row transition metal cation. Preferably, M is selected from Mn, Fe, Co, Ti, Ni, or a combination thereof. Examples of combinations of the transition metal substituents M include, but are not limited to, $Fe_{1-x}Mn_x$, and $Fe_{1-x}Ti_x$, where $0<x<1$. These materials may or may not have an ordered olivine structure.

As disclosed in US2007/0281215, the present invention also comprises surfaces comprising a material having a modified olivine structure, wherein modifications may be on the anionic or on the cationic site. Such materials, which are particularly useful as cathode materials in a lithium battery, may have the following general formula:

$$Li_{x+y}M_{1-(y+d+t+q+r)}D_dT_tQ_qR_r[PO_4][SO_4]_p[SiO_4][VO_4]v, \text{ where:}$$

M may be $Fe^{2+}$ or $Mn^{2+}$ or mixtures thereof; D may be a metal in the +2 oxidation state, preferably or $Mg^{2+}$, $Ni^{2+}$, $Co^{2+}$, $Zn^{2+}$, $Cu^{2+}$, or $Ti^{2+}$; T may be a metal in the +3 oxidation state, preferably $Al^{3+}$, $Ti^{3+}$, $Cr^{3+}$, $Fe^{3+}$, $Mn^{3+}$, $Ga^{3+}$, $Zn^{3+}$, or $V^{3+}$; Q may be a metal in the +4 oxidation state, preferably $Ti^{4+}$, $Ge^{4+}$, $Sn^{4+}$, or $V^{4+}$; and, R may be a metal in the +5 oxidation state, preferably $V^{5+}$, $Nb^{5+}$, or $Ta^{5+}$.

In this preferred embodiment, M, D, T, Q and R reside in octahedral sites. The additional coefficients may be defined as follows: x represents the degree of intercalation during operation of the electrode material; y represents the fraction of lithium ions on the (for example) initial $Fe^{2+}$ sites; d represents the fraction of divalent ions (noted as D) on the initial $Fe^{2+}$ sites; t represents the fraction of trivalent ions (noted as T) on the initial $Fe^{2+}$ sites; q represents the fraction of tetravalent ions (noted as Q) on the initial $Fe^{2+}$ sites; r represents the fraction of pentavalent ions (noted as R) on the initial $Fe^{2+}$ sites; p represents the fraction of hexavalent sulfur (as discrete $SO_4^{2-}$ tetrahedra) on the initial $P^{5+}$ sites; s represents the fraction of tetravalent silicon (as discrete $SiO_4^{4-}$ tetrahedra) on the initial $P^{5+}$ sites; and v represents the fraction of pentavalent vanadium ions on the initial $P^{5+}$ sites.

The conditions for site occupancy and electroneutrality imply the following: $0.1 \leq x \leq 1$; $y+d+t+q+r \leq 1$; $p+s+v \leq 1$; and $3+s-p=x-y+2t+2q+3r$.

x, y, d, t, q, r, p, s, and v may be between 0 (zero) and 1 (one), with at least one of y, d, t, q, r, p, s, or v differing from 0. In a preferred embodiment y, d, t, q, r, and v may vary between 0 (zero) and 0.2 (2/10) and p and s may vary between 0 (zero) and 0.5 (½).

These materials may be modified by adsorption of a compound of formula (1) as defined herein, in order to provide a surface having modified properties.

According to a specific embodiment, the present invention concerns a photoelectric conversion device, in particular a solar cell, comprising a surface as disclosed in this specification. Preferably, an electrode, in particular the photoelectrode and/or the counter electrode of the device comprises a surface according to the present invention.

According to a preferred embodiment, the present invention concerns a dye-sensitized solar cell comprising a porous semiconductor layer, wherein the compound of formula (1) is attached on the surface of the semiconductor layer, thereby providing a modified surface according to the invention. This specific embodiment will be described in more detail further below.

The surface of the present invention is a modified surface, in that a compound of formula (1) is absorbed on it. The compound of formula (1) is attached by way of its phosphinate and/or phosphinic acid group. Without wishing to be bound by theory, in case that the surface comprises free hydroxyl and/or thiol (sulfhydryl) groups, it is believed that the oxygen atoms of the phosphinate group is covalently bound to the lattice cation exposed at the surface in a monodentate or chelation fashion.

For the purpose of the present specification, the mentioning of phosphinic acid also encompasses reference to phosphinate, the deprotonated form of the acid, and vice versa. Accordingly, while the compound of formula (1) shows a phosphinic acid, the present invention also encompasses corresponding phosphinates.

In the compound of formula (1), $R_1$ and $R_2$ are selected, independently, from H, an organic substituent and from an organometallic substituent, provided that at least one of $R_1$ and $R_2$ is not H.

According to an embodiment, said organic substituent of formula (1) is a hydrocarbon comprising from 1-70 carbons and from 0-50 non-metal heteroatoms; and wherein said organometallic compound of formula (1) is a hydrocarbon comprising from 1-70 carbons, from 0-50 non-metal heteroatoms and from 1-10 metal atoms.

More preferably, at least one of $R_1$ and $R_2$ is an organic substituent comprising from 3-30 carbon atoms and from 0-20 non-metal heteroatoms. If any one of $R_1$ and $R_2$ is an organometallic substituent, it preferably comprises from 3-30 carbons, 0-20 non-metal heteroatoms and 1-5 metal atoms.

Preferred heteroatoms optionally present in $R_1$ and $R_2$ are halogens (F, I, Cl, Br), O, S, N, P, Se, As, and B. More preferably, heteroatoms, if present in $R_1$ and/or $R_2$, may be selected independently from O, S, N and halogen. This also applies to heteroatoms present or optionally present in the embodiments of $R_1$ and/or $R_2$ disclosed or encompassed further below, in particular in substituent's (I), (XV) and (XX) disclosed below.

For example, $R_1$ and $R_2$ may be selected from alkyl, alkenyl, akynyl and aryl, all of which may comprise heteroatoms and all of which may be further substituted. The alkyl, alkenyl, and akynyl may be linear, cyclic and/or branched. It is understood that a cyclic alkyl, for example is a subgroup of branched alkyls, but that there are branched alkyls that are not cyclic. The possibility of cyclic alkyls that are substituted with further alkyls, thereby providing additional branching, is also encompassed by the present invention.

The heteroatoms may be provided in the form of functional groups, or they may replace a carbon in the alkyl, alkenyl, akynyl and aryl mentioned above. For example, an oxygen atom may replace a carbon in an alkyl substituent, thereby forming corresponding ether. If one or more optional heteroatoms are provided in the form of a functional group, similarly, the group may, if possible, be further substituted. For example, an amino functional group may be further substituted with an alkyl, alkenyl, alkynyl and/or aryl.

According to an embodiment, one or both of $R_1$ and $R_2$ is/are a linear, branched and/or cylic alkyl. Such compounds may be useful as compacting compounds in dye-sensitized solar cells, as demonstrated at the example of dineohexyl phosphinic acid further below. Further examples of such compounds are described in EP 1620869. Such compounds may be also useful as co-adsorbent, for example on a semiconductor surface together with a dye in dye-sensitized solar cells.

According to another embodiment, one or both substituents $R_1$ and $R_2$ comprise a system of conjugated double bonds. The system of conjugated double bonds may be in the form of an alkenyl comprising conjugated double bonds and/or a system of one or more aryls and/or elkynyls arranged in a way as to provide a system of conjugated double bonds, for example. The same applies to alkynyls. The alkenyls and/or aryls may, of course, be further substituted and/or comprise heteroatoms as mentioned above. Such compounds may be useful as dye sensitizers in DSCs as further detailed further below.

One or both substituents $R_1$ and $R_2$ are independently selected from H, organic and organometallic light absorbing substituents, in particular dyes.

According to an embodiment of the present invention, $R_1$ and $R_2$ are both light absorbing substituents (dyes), for example as defined further below. In this case, $R_1$ and $R_2$ may be both organic or both organometallic dyes, or one selected of $R_1$ and $R_2$ is an organic light absorbing substituent and the other is an organometallic light absorbing substituent.

According to another embodiment, one selected of $R_1$ and $R_2$ is not a light absorbing substituent, but H or an organic substituent, for example a substituent having compacting properties as mentioned above, assisting in beneficial arrangements of dye molecules and/or the compounds adsorbed on the surface of the invention. In this case, the other of $R_1$ and $R_2$ may be a light absorbing entity, in particular selected from organic and organometallic light absorbing substituents, such as those disclosed herein.

According to a further embodiment, both, $R_1$ and $R_2$ are not selected from light absorbing substituents, but independently from H and, preferably organic, substituents having no light absorbing properties, for example substituents having properties supporting efficient, dense and/or compact adherence of dye molecules to the surface of the invention.

According to an embodiment, at least one of $R_1$ and $R_2$ is, independently from the other, selected from an amino acid, an oligopeptide or a polypeptide, for example an enzyme, an antibody, an RGD-, RGDS-, RGDV- and/or RGDE-peptide, a signal peptide, a hormone peptide. Such peptides may be further modified or substituted, a marker such as a fluorescent compound, a nucleic acid such as a DNA or RNS molecule. At least one selected from $R_1$ and $R_2$ may further be selected from a carbohydrate and/or from a lipid. $R_1$ and $R_2$ may also be selected from compounds that have combined structural elements of the above mentioned biological compounds, for example a lipoprotein, glycoproteins, peptidoglycan, and the like. These kinds of substituents $R_1$ and/or $R_2$ are particularly useful in biological sensors, biological tests such as ELISA and the like.

The compound of the invention may be a sensitizing dye for a dye sensitized solar cell. Many sensitizing dyes of dye-sensitized solar cells have already been reported. Organic and organometallic dyes are distinguished. The present invention provides a dye comprising, as an anchoring group, a phosphinic acid group as defined by formula (1). One or both, or part, of $R_1$ and/or $R_2$, may constitute a light-absorbing entity. The phosphinic acid group thus anchors the dye to the surface of the photoelectrode. If one of $R_1$ or $R_2$ may constitute a light-absorbing entity, the other substituent may constitute a compacting and/or co-adsorbent entity.

Further below, some exemplary definitions for $R_1$ and $R_2$ are given, which are particularly applicable for sensitizing dyes of dye-sensitized solar cells. However, the definitions of $R_1$ and/or $R_2$ also apply to compounds of formula (1) in other type of devices and/or device structures, as those mentioned above, for example.

According to an embodiment, which may apply to an organic dye adsorbed on the surface of the photoanode of a DSC, for example, one or both of $R_1$ and $R_2$ may, independently, be selected from a substituent of formula (I) below:

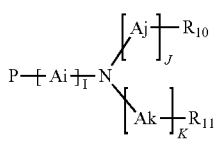
(I)

wherein:
P is shown for reasons of clarity and represents the phosphorous atom of the phosphinate group in the compound of formula (1), the remainder of the phosphinate group, in particular the respective other of $R_1$ and $R_2$ not being shown;

I, J, and K represent, independently one from the other, an integer selected from 1 to 15, preferably 1 to 7, more preferably 1 to 3, wherein J and K, if $R_{10}$ and $R_{11}$ are not H and do not start with a heteroatom, respectively, may also be 0, Aj and Ak thus being, independently, optionally absent; wherein said integer I, J, and K defines the number of successive moieties A in a respective chain of moieties;

i is an integer of the group of integers $1, \ldots, I$, wherein any Ai represents the $i^{th}$ moiety A of the I successive moieties in the respective chain of moieties, which Ai may be different or the same from any other moiety Ai;

j is an integer of the group of integers $1, \ldots, J$, wherein any Aj represents the $j^{th}$ moiety A of the J successive moieties in the chain of moieties, which Aj may be different or the same from any other Aj;

k is an integer of the group of integers $1, \ldots, K$, wherein any Ak represents the $k^{th}$ moiety A of the K successive moieties in the chain of moieties, which Ak may be different or the same from any other Ak;

any A is, independently from any other A, selected from methylene (—C—), vinylene (—C=C—), ethynediyl (—C≡C—) and aryl moieties comprising two free valencies (ar-diyl), wherein said ar-diyl moiety may comprise heteroatoms and wherein said methylene, vinylene or ar-diyl may be further substituted;

$R_{10}$ and $R_{11}$ are selected from H, alkyl, alkenyl, alkynyl, aryl, hydroxyl, nitryl, amino, amido, acyl, alkyl, cycloalkyl, alkoxyl, alkylsulfonyl, alkylthio, ester groups, alkyl halide, halogen, sulfonyl, cyano, acyloxyl, carboxyl and heterocycles; wherein said alkyl, alkenyl, alkynyl, aryl may comprise one or more heteroatoms and which alkyl, alkenyl, alkynyl may be linear, branched or cyclic. $R_{10}$ and/or $R_{11}$ is/are preferably attached to a carbon or a nitrogen atom of the respective A. If $R_{10}$ and/or $R_{11}$ is/are attached to a nitrogen atom, substituents having a heteroatom as first atom are excluded (amido, amine, hydroxyl, alkoxyl, etc.).

For example, if I is 3, $A_{i=1}$, $A_{i=2}$ and $A_{i=3}$ are the A moieties that succeed one the other in this order from the P atom to the nitrogen atom. The same applies to J and K, with $A_{k=1}$ and $A_{j=1}$ being the moiety connected to the nitrogen atom in formula (I).

Examples of ar-diyl moieties A in the substituent of formula (I) may be selected from the bivalent substituents of formulae (II)-(X) below:

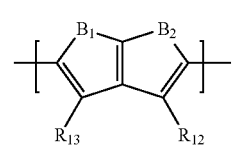
(II)

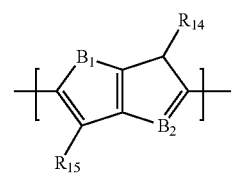
(III)

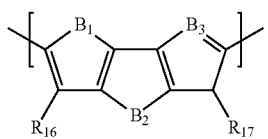
(IV)

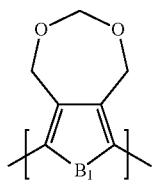
(V)

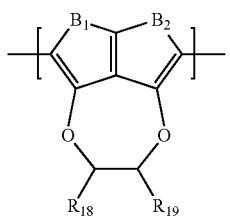
(VI)

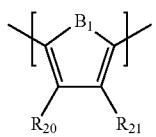
(VII)

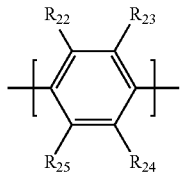
(VIII)

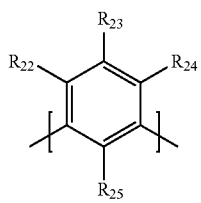
(IX)

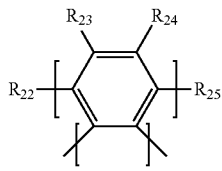
(X)

wherein $B_1$, $B_2$, $B_3$ are independently selected from C, O, and S, preferably from O and S, and may be the same or different;

$R_{12}$-$R_{25}$ are selected from H, alkyl, alkenyl, alkynyl, aryl, hydroxyl, nitryl, amido, acyl, alkyl, cycloalkyl, alkoxyl, alkylsulfonyl, alkylthio, ester groups, alkyl halide, halogen, sulfonyl, cyano, acyloxyl, carboxyl and heterocycles; wherein said alkyl, alkenyl, alkynyl, aryl may comprise one or more heteroatoms and which alkyl, alkenyl, alkynyl may be linear, branched or cyclic; and, wherein brackets are shown in order to indicate the position of the moiety with respect to the substituent of formula (I).

If substituents $R_{10}$-$R_{25}$ are alkyl, alkenyl, alkynyl and/or aryl, heteroatoms may be provided in the form of a functional group comprising one or more heteroatoms, (for example, an amino, hydroxyl, mercapto, oxo, carboxy, halogen, cyanato, hydroperoxy, hydroxyamino, isocyanato, isothiocyanato, nitro, thiocyanato, thiocarboxy, sulfonate, sulfinate, sulfenic acid group) or a heteroatom may replace a carbon in a chain of said alkyl, alkenyl, alkynyl, and/or aryl. Preferably, the substituents $R_{12}$-$R_{25}$ are selected, independently, from H, alkyl, alkenyl, alkynyl, and aryl, wherein the alkyl, alkenyl, and alkynyl does not contain any heteroatom, and is linear or branched.

Substituents $R_{10}$-$R_{25}$ may have 0 to 20, preferably 1 to 12 and more preferably 2 to 6 carbons and from 0-10, preferably 0-5, more preferably 0-3 heteroatoms.

Moieties (VIII)-(X) are phenylene, for example 1,4-phenylene (VIII) or 1,3-phenylene (IX), moiety (VII) with $B_1$=S, $R_{20}$ and $R_{21}$ being H is 2,5-thiophene-diyl, moiety (VII) with $B_1$=O and $R_{20}$ and $R_{21}$=H is 2,5-furandiyl.

Further suitable ar-diyl moieties are disclosed in the co-pending PCT applications PCT/IB2009/050441, in particular moieties (2)-(21) on page 3, line 22 to the end of page 6 and preferred embodiments of substituents of these moieties of the application as filed; and PCT/IB2009/050800, in particular the moieties of formulae (2)-(33) from page 4, line 4 to page 7, line 11 and preferred embodiments of substituents. These PCT applications and in particular the indicated text positions and moieties are expressly and specifically incorporated herein by reference.

If one of $R_1$ and $R_2$ is not a substituent of formula (I), it may be H or any of the other substituents mentioned above or below for $R_1$ and/or $R_2$.

According to a preferred embodiment, one or both of $R_1$ and $R_2$ are selected from the substituent (I) above, with I being 1 and $A_1$ representing a ar-diyl, said ar-diyl being preferably selected from the moieties (II)-(X) above and more preferably from a phenylen, a thiophene-diyl or a furandiyl, which optionally may be further substituted, as indicated for substituents $R_{20}$-$R_{25}$ above.

Figure 3:
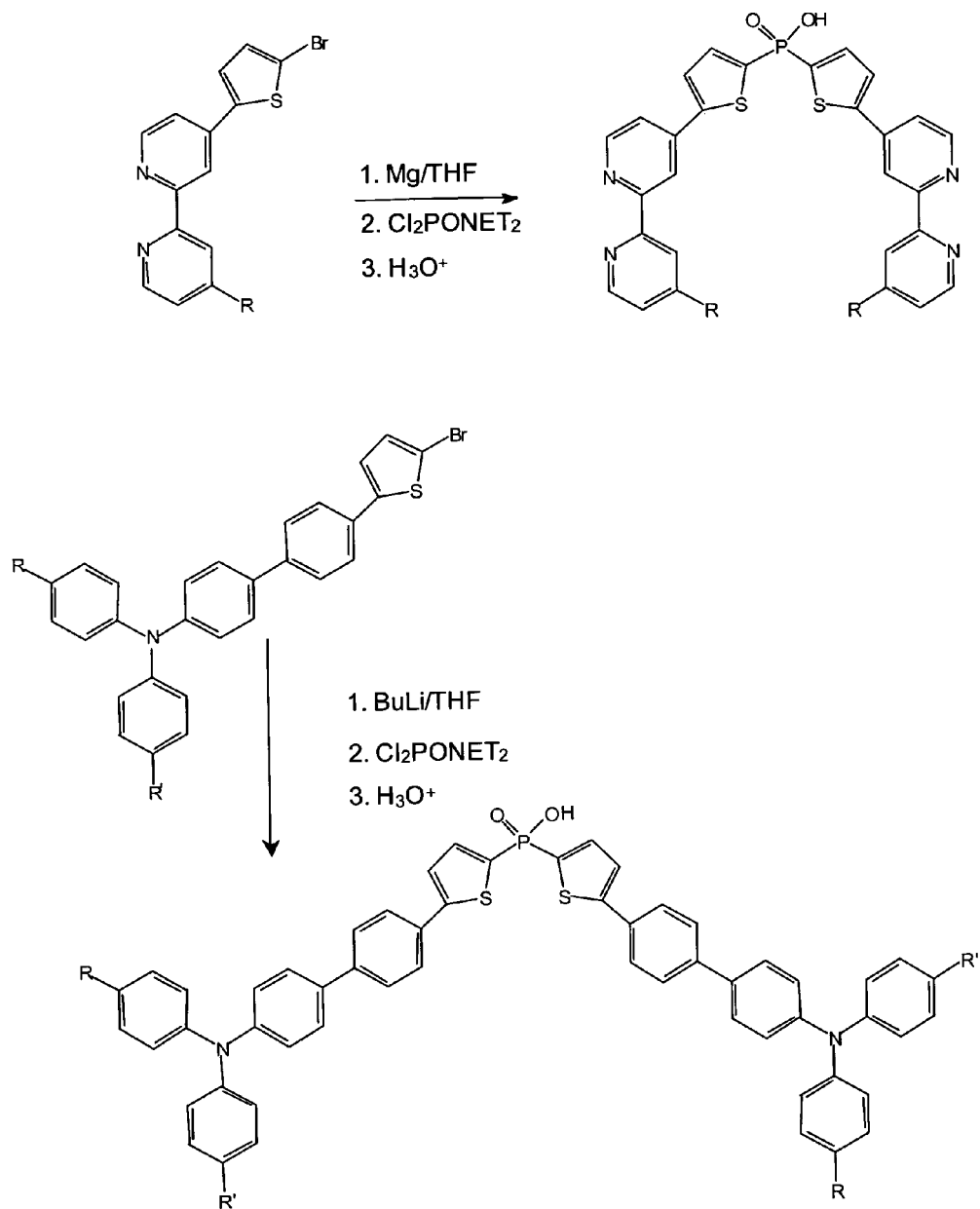
FIG. 3 is a scheme illustrating exemplary synthetic approaches for compounds of the invention, in particular for anchoring ligands of metal sensitizers, shown on top, or for organic triaryl dyes, shown on the bottom.

The synthesis of an exemplary compound according to formula (I) is illustrated in the scheme on the bottom half of FIG. 3. In the compound obtained, $R_1$ and $R_2$ (with respect to the compound of formula (1)) are identical; with respect to the compound of formula (I), I=3, J and K are both 1, Ai=1 being thiophen-2,3-diyl, Ai=2, Ai=3, Aj=1 and Ak=1 are all 1,4-phenylene. According to the scheme in FIG. 3, The starting 4-triphenylaminophenyl-substituted 2-bromo-thiophene is transformed with butyllithium to its carbanion, which is reacted with dichloro-N,N-diethylphosphinic amide to obtain, after hydrolysis, the corresponding di(2-thienyl)phosphinic acid.

According to yet a further preferred embodiment, the compound of formula (1) is one selected of the compounds of formula (2) or (3) below:

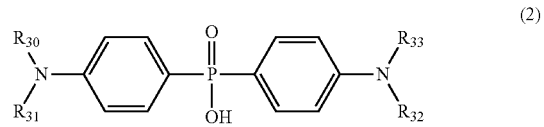
(2)

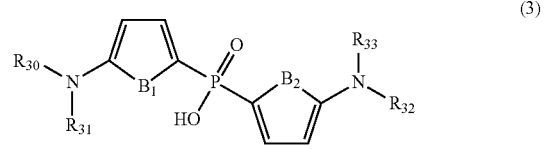
(3)

wherein $R_{30}$-$R_{33}$ are independently selected from are alkyl, alkenyl, alkynyl and/or aryl, optionally comprising one or more heteroatoms and optionally being further substituted. $R_{30}$-$R_{33}$ may be defined, independently, as the substituent -[Ak]$_k$-$R_{11}$ or -[Aj]$_j$-$R_{10}$ in substituent of formula (1) above. Preferably $R_{30}$-$R_{33}$ are selected from phenyl and aromatic condensed ring systems, wherein said phenyl and aromatic condensed ring system may be further substituted. Examples of further substituents include alkyl, alkenyl, alkynyl and functional groups comprising heteroatoms as defined for $R_{10}$-$R_{25}$ above. More preferably $R_{30}$-$R_{33}$ are independently selected from substituted and unsubstituted phenyls.

Substituents $R_{30}$-$R_{33}$ preferably comprise from 4-30, preferably from 6-20 carbons and from 0-10, preferably 0-5 heteroatoms.

According to another embodiment, the compound of formula (1) is a dye comprising a metal atom. Accordingly, at least one of the substituents $R_1$ and $R_2$ preferably comprises a structural element suitable to bind to a metal atom by way of a complex bond, for example. Such compounds are useful as sensitizing dyes in DSCs, and the ligand comprising the phosphinate group is thus the anchoring ligand.

According to an embodiment, at least one of the substituents $R_1$ and $R_2$ comprises a pyridine, preferably a polypyridine, such as a bi- or tripyridine, for example.

According to an embodiment, the compound of formula (1) of the present invention is selected from, or comprises as a structural part, one of the compounds of formulae (5)-(19) below:

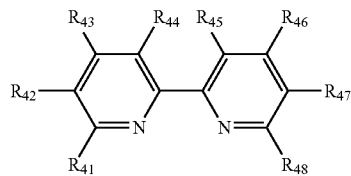
(5)

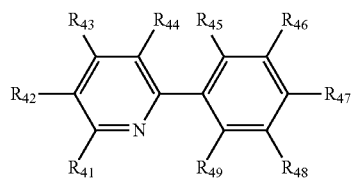
(6)

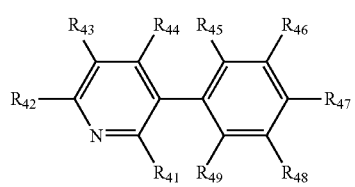
(7)

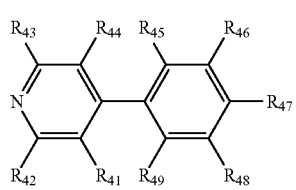
(8)

-continued

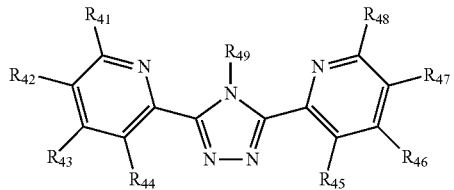
(9)

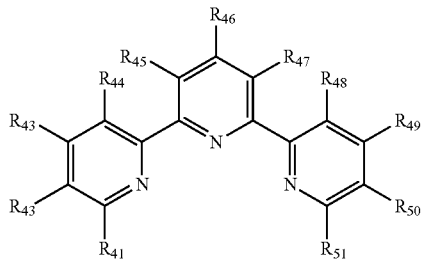
(10)

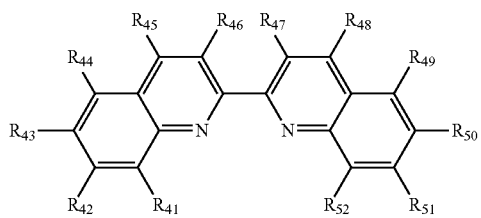
(11)

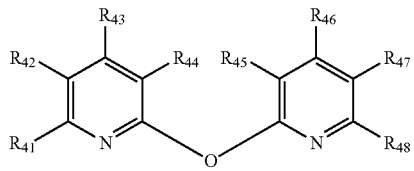
(12)

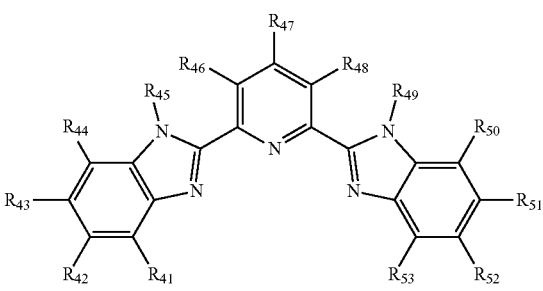
(13)

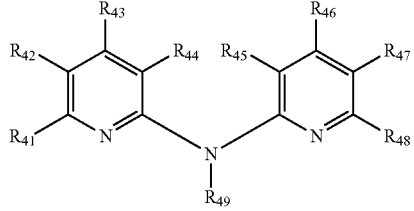
(14)

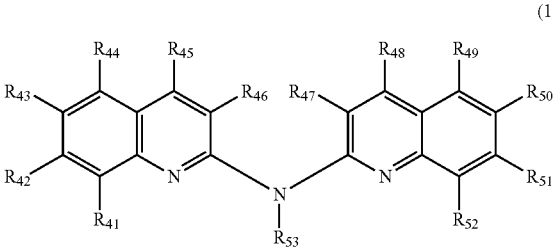
(15)

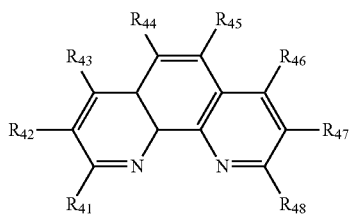
(16)

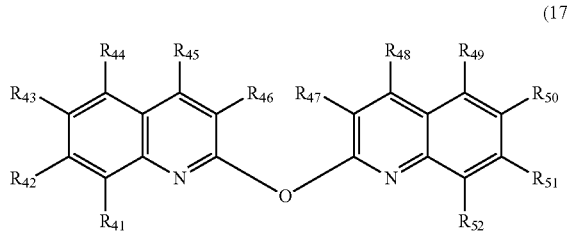
(17)

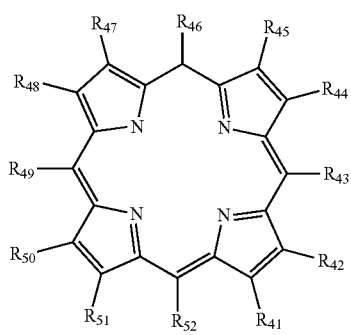
(18)

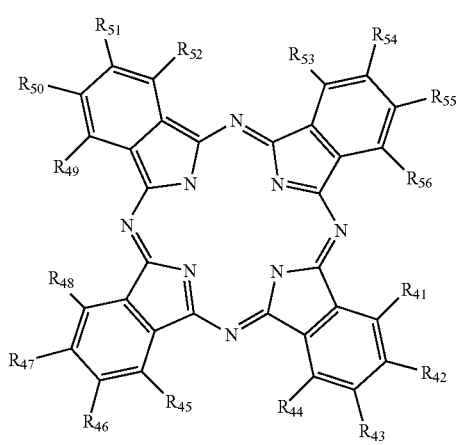
(19)

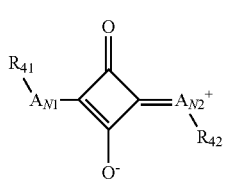
(19a)

wherein:
at least one substituent Rx of any one of compounds (5)-(19a) has the definition of formula (XV) below:

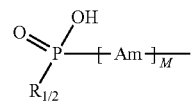
(XV)

wherein the bond on the right end of formula (XV) designs the attachment to the polypyridine structure of any one of formulae (5)-(19);

M represents 0 or an integer selected from 1 to 15, preferably 1 to 7, more preferably 1 to 3, and defines the number of successive moieties Am in a chain of moieties;

m, if M≥1, is an integer of the group of integers 1, . . . , M, wherein any Am represents the $m^{th}$ moiety A of the M successive moieties in the respective chain of moieties, which Am may be different or the same from any other moiety Am;

A is defined as above with respect to substituent (I) and its preferred embodiments;

$R_{1/2}$ represents the respective other substituent $R_1$ or $R_2$, of the compound of formula (1) above, and is thus as defined as $R_1$ and $R_2$ in formula (1). Of course, $R_1$ and $R_2$ may be identical.

the other substituents Rx may be selected from H, halogen, hydroxyl, sulfhydryl, nitryl (—CN), cyanate, isocyanate, amine, acyl, carboxyl, sulfinyl, oxo, and from hydrocarbons comprising 1-50 carbons and one or more heteroatoms, with the proviso that said substituents R of the compounds of formulae (5)-(14) that are connected to a nitrogen atom are only selected from hydrocarbons comprising 1-50 carbons and one or more heteroatoms and that a said substituent is attached to said nitrogen by a nitrogen-carbon bond;

two Rx of neighboring carbons may be connected to each other forming a system of one or more rings fused to the ring or rings of the structure of formula (1)-(19) to which they are attached;

wherein, in compound (19a), $A_{N1}$ and $A_{N2}$ are, independently one from the other, aromatic hydrocarbons comprising a nitrogen atom, wherein substituent's $R_{41}$ and $R_{42}$ may be connected to a nitrogen or a carbon atom of said aromatic hydrocarbon, and wherein at least one of $A_{N1}$ and $A_{N2}$ carries a positive charge by way of a quaternary nitrogen atom.

In the compounds of formula (19a) above, examples for $A_{N1}$ and $A_{N2}$ comprise substituted indolium and aniline. Specific examples of $A_{N1}$ and $A_{N2}$ in formula (19a) are 1,2,3,3-tetramethyl-3H-indolium salt and aniline derivatives of squaraine dyes. The terms squaraine and squarine design the same class of compounds. The squaraine dyes of formula (19a) are substituted. At least one substituent is a hydrocarbon comprising a phosphinic acid anchoring group of formula —P($R_{1/2}$)(O)(OH). The substituents may be provided at a carbon and/or at a nitrogen atom, for example, at any position of a benzene ring comprised in the squaraine dye, for example the benzene ring of the indolium or the aniline mentioned above. The respective other substituent $R_1$ or $R_2$, respectively, may be independently defined as herein, or be another or identical squaraine dye. The phosphinic acid anchoring group may comprise a hydrocarbon linker or may be directly attached to the dye. A hydrocarbon linker may thus have from 1-20, preferably 1-7 carbons and 0-10 heteroatoms as defined herein.

Rx represents an integer of 41-56 and designs all the substituents R in a compound of formulae (5)-(19), respectively. Accordingly, in the compounds of formulae (5), (12) and (16), Rx represents any one of the substituents $R_{41}$-$R_{48}$. Accordingly, in the compounds of formulae (9) and (14), Rx represents any one of the substituent's $R_{41}$-$R_{49}$, in the compound of formula (10) $R_{41}$-$R_{51}$, in the compounds of formulae (11), (17) and (18) $R_{41}$-$R_{52}$, in the compound of formulae (13) and (15) $R_{41}$-$R_{53}$, in the compound of formula (19) $R_{41}$-$R_{56}$ and in the compound of formula (19a) $R_{41}$ and $R_{42}$.

According to an embodiment, the substituents Rx selected from hydrocarbons comprising 1-50 carbons and one or more heteroatoms, said hydrocarbon being different from (XV) in the compound of any one of formulae (5)-(19a), are selected from alkyl, alkenyl, alkynyl, and aryl, which are or are not further substituted, wherein said alkyl, alkenyl, alkynyl may be linear, branched or cyclic, wherein one or more carbon atom in said alkyl, alkenyl, alkynyl, and aryl may be replaced by any heteroatom and/or group selected from the group of —O—, —C(O)—, —C(O)O—, —S—, —S(O)—, —SO$_2$—, —S(O)$_2$O—, —N=, —P=, —NR'—, —PR'—, —P(O) (OR')—, —P(O)(OR')O—, —P(O)(NR'R')—, —P(O) (NR'R')O—, P(O)(NR'R')NR'—, —S(O)NR'—, and —S(O)$_2$NR', with R' being H, a C1-C6 alkyl, optionally partially or totally perfluorinated, and/or a phenyl, or a monocyclic aromatic heterocycle, optionally partially or totally perfluorinated.

According to a preferred embodiment, any substituent different from (XV) in a compound of any one of formulae (5)-(19a) is H or comprises from 1-30 carbons and 0-20 heteroatoms. Preferably, it comprises from 2-20 carbons, more preferably 2-10 carbons and 0-15, preferably 0-5 heteroatoms.

According to a preferred embodiment, any substituent Rx different from (XV) in a compound of any one of formulae (5)-(19a) in is independently selected from H, alkyl, preferably C1-C10 alkyl, alkenyl, preferably C2-C10 alkenyl, alkynyl, preferably C2-C10 alkynyl, and aryl, preferably C4-C20 aryl. Preferably, any Rx different from (XV) is selected from H and alkyl.

According to an embodiment of the compound of formula (5), one or both of substituents $R_{43}$ and $R_{46}$ is selected from a substituent of formulae (XV) as defined herein. The other substituent may preferably be selected from H, alkyl, alkenyl, alkynyl and aryl.

According to an embodiment of the compounds of formulae (6)-(8), one or more of substituents $R_{45}$-$R_{49}$, preferably one or more of substituent's $R_{46}$-$R_{48}$ is selected from a substituent of formulae (XV) as defined herein. According to an embodiment, substituents $R_{41}$-$R_{44}$ are H, alkyl, alkenyl, alkynyl and aryl, more preferably H.

According to an embodiment of the compound of formula (18), one or more of substituents $R_{41}$, $R_{42}$, $R_{44}$, $R_{45}$, $R_{47}$, $R_{48}$, $R_{50}$ and $R_{51}$ is selected from a substituent of formulae (XV) as defined herein. Reference is made to WO2006/038823, which discloses alkenyl substituent's comprising one or more conjugated double bonds and a terminal anchoring group. Such compounds, with the anchoring groups of the prior art, such as carboxylic acid, phosphonic acid, sulfonic acid, or salts thereof being replaced by a phosphinic acid group are encompassed by the present invention. According to an embodiment of the compound of formula (18), in the substituent (XV) above, the M Am=1-4 may be vinylene (—C=C—), and/or 1,4-phenylene, M may be an integer from 1-4. According to an embodiment, $R_{43}$, $R_{46}$, $R_{49}$, and $R_{52}$ are preferably independently selected from H, substituted and unsubstituted alkyl, substituted and unsubstituted aryl, and unsubstituted alkyl arly (alkaryl).

According to an embodiment of the compound of formula (19), one or more of substituents $R_{42}$, $R_{43}$, $R_{46}$, $R_{47}$, $R_{450}$, $R_{51}$, $R_{54}$ and $R_{55}$ is selected from a substituent of formulae (XV) as defined herein. Reference is made to the compounds disclosed in WO2008/145172, which is entirely incorporated herein by reference. The present invention encompasses substituted phtalocyanine compounds as disclosed in WO2008/145172, in which the carboxylic acid (—COOH) anchoring group is replaced by a phosphinic acid (—P($R_1$)($R_2$)OOH) anchoring group. Accordingly, according to an embodiment, one selected from $R_{53}$-$R_{56}$ may be an anchoring ligand of formula (XV), while at least one of $R_{41}$-$R_{44}$, at least one of $R_{45}$-$R_{48}$, and/or at least one of $R_{49}$-$R_{52}$ is an alkyl, preferably a branched alkyl, for example tert-butyl.

According to an embodiment, at least one of the substituent's $R_1$ and $R_2$ of the compound of formula (1) comprises a bi-pyridine structure according to the substituent of formula (XX) below:

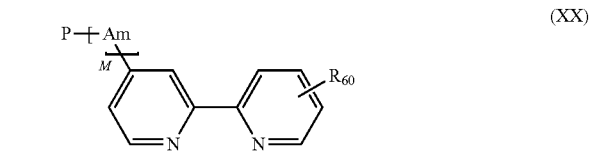

(XX)

wherein P is shown for reasons of clarity and represents the phosphor atom of the compound of formula (1), to which the substituent $R_1$ and/or $R_2$ is attached, the respective other substituent $R_2$ and/or $R_1$ thus not being shown, but possibly being identical;

M represents 0 or an integer selected from 1 to 15, preferably 1 to 7, more preferably 1-3, and defines the number of successive moieties Am in a chain of moieties;

m is an integer of the group of integers 1, ..., M, wherein any Am represents the m$^{th}$ moiety A of the M successive moieties in the respective chain of moieties, which Am may be different or the same from any other moiety Am;

A is defined as above with respect to substituent (I) and its preferred embodiments;

$R_{60}$ is independently defined as substituent on the other of the two pyridine rings (-[Am]$_M$-P) or is independently defined as $R_{10}$ and $R_{11}$ in substituent (I) and their preferred embodiments.

According to an embodiment, $R_1$ and $R_2$ both comprise a pyridine-containing structure, which may be the same or different. For example, the compound of formula (1) may comprise, as a structural entity, for example as a ligand, a compound of formula (20) below:

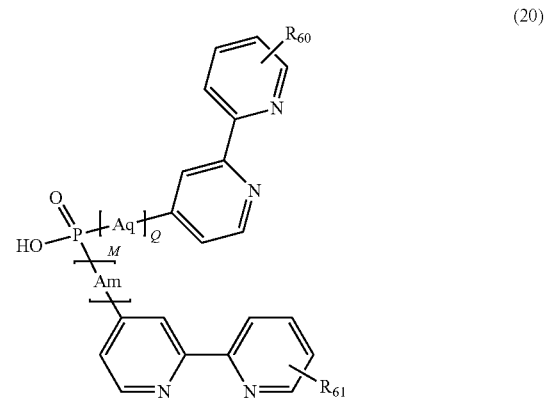

(20)

wherein M, m, A, $R_{60}$ are as defined as above, $R_{61}$ is, independently, defined as $R_{60}$;

Q represents 0 or an integer selected from 1 to 15, preferably 1 to 7, and defines the number of successive moieties Aq in a chain of moieties;

q is an integer of the group of integers 1, ..., Q, wherein any Aq represents the $q^{th}$ moiety A of the Q successive moieties in the respective chain of moieties, which Aq may be different or the same from another moiety Aq.

The synthesis of an exemplary compound according to formula (20) is illustrated in the upper part of FIG. 3. The starting 4-bipy-substituted 2-bromo-thiophene is transformed to a Grignard reagent, which is reacted with dichloro-N,N-diethylphosphinic amide to obtain, after hydrolysis, the corresponding di(2-thienyl)phosphinic acid. In the compound obtained, Aq and Am are thio-2,5-diyl and Q and M are 1, $R_{60}$ and $R_{61}$ are at position 4' of the respective bi-pyridine.

According to an embodiment of the invention, a polypyridyl moiety carries two or more phosphinate anchoring groups, the polypyridine being bound to a metal. The embodiment according to formula (21) below exemplifies this principle:

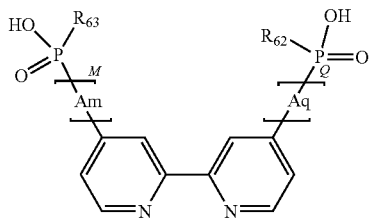

(21)

wherein identical letters are defined as above, $R_{62}$ and $R_{63}$ are defined as $R_1$ and $R_2$, preferably as $R_{10}$ and $R_{11}$ above, with the proviso that the atom connected to the phosphor atom is a carbon. Preferably, $R_{62}$ and $R_{63}$ are independently selected from substituted and unsubstituted alkyls, alkenyls alkynyls and aryls as defined above. Preferably, $R_{62}$ and $R_{63}$ are, independently, selected from C1-C5 alkyls.

According to an embodiment, any Am, Aq in substituent's (XV) and (XX) above and/or in compounds (20) and (21) above may be independently selected from the moieties A as defined above, for example from moieties (II)-(X) above.

According to a further embodiment, the compound of formula (1) comprises a structure of formula (22) below:

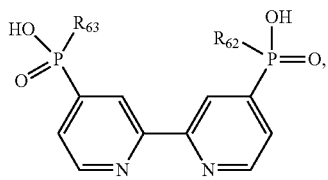

(22)

wherein $R_{62}$ and $R_{63}$ are as defined as above.

The compound of formula (1) may be constituted as shown in formulae (5)-(21), or, as mentioned above, comprise a compound of formula (5)-(21) as a structural unit. The latter is particular the case, if the compound of formula (1) is an organometallic compound. In this case, the compounds of formula (5)-(21) preferably form a ligand, more preferably an anchoring ligand of the organometallic compound, said ligand being bound by way of the poly-pyridine structure to the metal atom.

Accordingly, in an embodiment of the present invention, the compound of formula (1) is an organometallic compound of formula (30)-(33) below:

$$ML_1(L_2)_2L_3 \quad (30);$$

$$M(L_1)_2(L_2)_2 \quad (31);$$

$$ML_1L_3L_4 \quad (32);$$

$$ML_1(L_2)_4 \quad (33)$$

wherein M is a metal atom selected from Ru, Os, Fe, Re, Rh and Ir;

$L_1$ is a mono-bi- or tridentate pyridine-containing ligand comprising at least one phosphinate anchoring group, for example a compound according to formulae (5)-(22), preferably a bidentate polypyridine ligand;

$L_2$ is a monodentate ligand, which may be selected, for example, from halogen, in particular Cl and Br; $H_2O$; isothiocyanate ($NCS^-$), $CN^-$, $NCO^-$, $NCSe^-$, or another compound having a free electron pair capable of binding to M;

$L_3$ is a bidentate ligand which does not comprise an anchoring group. Examples are bipyridine and substituted bipyridines. According to an embodiment, $L_3$ is a ligand selected from a compound of formula (40) below:

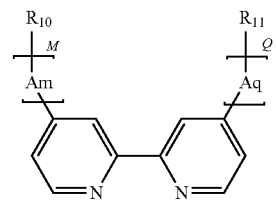

(40)

wherein all elements are as defined above.

$L_4$ may be selected, independently, from ligands as defined for $L_1$ and $L_3$.

Accordingly in an embodiment, the present invention provides an anchoring ligand in a sensitizing dye, said anchoring ligand comprising at least one phosphinate anchoring group.

The present invention also relates to photoelectric conversion devices, in particular solar cells. For the purpose of illustration, the present invention is explained at the embodiments of such devices shown in FIGS. 4-6. The device shown in FIG. 4 can also be considered as a flexible device.

The device of the present invention comprises at least one substrate 1. Contrary to the device shown in FIG. 4, the present invention also encompasses devices having only one substrate 1, for example only a top or only a bottom substrate 1, as is shown more specifically in FIG. 6. Preferably, there is a substrate facing the side of the device intended to be exposed to electromagnetic radiation for production of electrical current. The substrate facing radiation is preferably transparent. Transparency, for the purpose of the present invention, generally means that the respective structure (for example substrate, counter electrode, conductive layer, porous semiconductor) is transparent to at least some visible light, infrared light or UV light, in order to convert this light to electrical energy in the device of the invention. Preferably, transparent means transparent to all visible light, more preferably also to some of the near infra-red and/or also to at least part of the ultraviolet light spectrum.

The substrate 1 may be made from plastic or from glass. In flexible devices, the substrate 1 is preferably made from plastic. In an embodiment, the substrate comprises a plastic selected from the groups of polyethylene terephthalate, polyethylene naphthalate, polycarbonate, polypropylene, polyimide, 3-acetyl cellulose, and polyethersulfone, for example.

Figure 6:
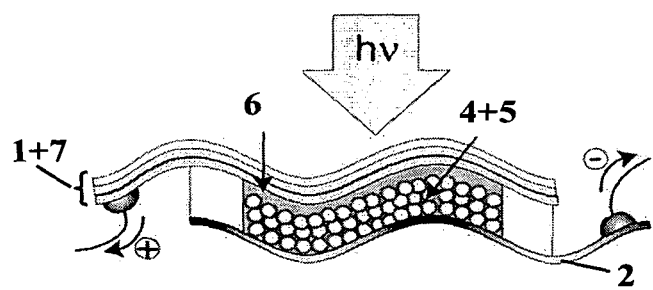
FIG. 6 is a schematic representation of a flexible device according to the invention.

The conversion devices of the present invention generally have two conductive layers 2 and 7, wherein a first conductive layer 2 is required for removing the electrons generated from the device, and a second conductive layer 7 for supplying new electrons, or, in other words, removing holes. This is illustrated in FIG. 6 by the signs + and −. The conductive layers 2 and 7 may be provided in many different forms and may be made from various materials, depending on the purpose or nature of the device.

The second conductive layer 7 is generally part of the counter electrode 7 and is already part of the substrate, as is the case, for example with ITO (indium tin oxide)-coated plastic or glass, where the transparent ITO is coated on the plastic or glass and makes the later electrically conductive.

Accordingly, one or both conductive layers 2 and 7 may comprise a transparent metal oxide, such as indium doped tin oxide (ITO), fluorine doped tinoxide (FTO), $ZnO$—$Ga_2O_3$, $ZnO$—$Al_2O_3$, tin-oxide, antimony doped tin oxide (ATO) and zinc oxide.

According to embodiments of the invention, only the first conductive layer 2 or only the second conductive layer 7 comprises a transparent metal oxide layer as defined above. It is also possible to provide one or both of the two opposed conductive layers 2 and 7 in the form of a conductive foil, for example a metal foil, in particular a titanium foil or zinc foil. This is preferred, for example, in some flexible devices, as detailed below. Preferably, the first conductive layer 2, is made from a conductive metal foil, for example, as is shown in FIG. 6. Such a foil may not be transparent.

The device of the present invention generally comprises a counter electrode 7, which faces an intermediate layer 6 towards the inside of the cell, and the substrate 1 on the outside of the cell, if such substrate is present. The counter electrode generally comprises a catalytically active material, suitable to provide electrons and/or fill holes towards the inside of the device. The counter electrode may thus comprises materials selected from material selected from Pt, Au, Ni, Cu, Ag, In, Ru, Pd, Rh, Ir, Os, C, conductive polymer and a combination of two or more of the aforementioned, for example. Conductive polymers may be selected from polymers comprising polyaniline, polypyrrole, polythiophene, polybenzene and acetylene, for example.

Figure 4:
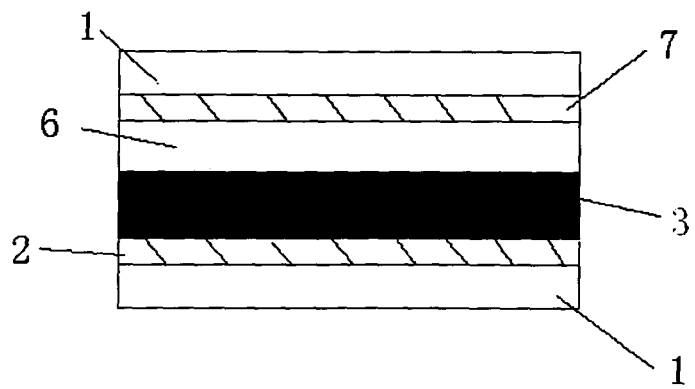
FIG. 4 is a schematic representation of an exemplary DSCs according to the invention.
Figure 5:
FIG. 5 is a schematic representation of the light absorbing layer 3 of the device shown in FIG. 4.

In FIG. 4, the second conductive layer can be considered as part of the counter electrode 7 or as part of the substrate 1 on the top of the device, and is thus not separately shown. If the second conductive layer is considered to be part of the substrate 1, such substrate could be plastic or glass coated with ITO or other materials, as mentioned above, for example.

In FIG. 4, layer 3 is a light absorption layer, which comprises actually at least two separate layers, namely a porous semiconductor layer 4 and, absorbed thereon, a layer of sensitising dyes 5. The porous semiconductor layer may be produced by processes described in the art (B. O'Reagan and M. Grätzel, Nature, 1991, 353, 373) from semiconductor nanoparticles, in particular nanocrystalline particles. Such particles generally have a mean diameter of about 0.5-1000 nm, for example 5-500 nm. Such nanoparticles may be made from a material selected from the group of Si, $TiO_2$, $SnO_2$, ZnO, $WO_3$, $Nb_2O_5$ and $TiSrO_3$, for example. The constitution of the porous layers from nanocrystalline particles is clearly visible in the schematic FIG. 6, showing an embodiment of a flexible cell according to the invention.

The dye layer 5 comprises a compound according to the invention. The compound may be, for example, a co-adsorbed "compacting" compound as exemplified above. There may optionally also, in addition or instead, be state of the art compacting compounds, such as those disclosed in WO2004/097871A1, be adsorbed in layer 5.

Layer 5 may comprise or be constituted by at least one dye or sensitizer, or a combination of two or more different sensitizers. According to an embodiment, the dye is a compound of the invention comprising a phosphinic acid anchoring group. For example, the dye may be an organic or an organometallic compound as disclosed herein. Examples of organometallic compounds encompass ruthenium dyes. Other dyes than those disclosed herein be used in combination or instead, for example those disclosed in WO2006/010290.

The dye layer may comprise organic sensitizers. For example, the device may be free of any sensitizer using ruthenium or another noble metal. According to a preferred embodiment of the present invention, the photoelectric conversion device comprises the organic sensitizers of the present invention, in particular an organic compound of formula (1) with one or both $R_1$ and/or $R_2$ being selected from substituents of formula (I). According to an embodiment, the present invention comprises a sensitizing dye according to the invention, with one of $R_1$ and $R_2$ being an organic substituent, for example according to formula (I), and the other of $R_1$ and $R_2$ being an metal-based substituent, for example by way of a ligand as defined in formula (5)-(14), or as defined in formula (30)-(33).

The device of the present invention has a layer 6 having the general purpose of mediating the regeneration of electrons in the dye, which were removed due to radiation. These electrons are provided by the counter electrode 7, and layer 6 thus mediates the transport of electrons from the counter electrode to the dye, or of holes from the dye to the counter electrode. The transport of electrons and/or holes may be mediated by electrically conductive materials as such and/or by diffusion of charged molecules having a suitable redox potential. Accordingly, the layer 6 may be an electrolyte layer and/or an electrically conductive charge transport layer.

According to a preferred embodiment of the invention, this intermediate layer 6 is substantially free of a solvent. This embodiment is particularly relevant with respect to flexible devices. Substantially free means, for the purpose of the present invention, that the layer comprises less than 10% by weight, more preferably less than 5 wt. %, even more preferably less than 1% and most none added solvent at all. In contrary to many prior art devices and in particular to flexible devices made from polymers, the fact that the intermediate layer is solvent free provides the important advantage that there is no degradation due to solvent evaporation through the one or two substrate layer(s) 1.

According to an embodiment, the solvent-free layer is an electrolyte layer comprising one or more ionic liquids and, optionally additives designed to improve stability and/or the performance characteristics of the device, such as N-alkylbenzimidazole, wherein the alkyl is a C1-C10 alkyl, which may be halogenated, for example.

Electrolytes comprising as a major component ionic liquids (ionic-liquid based electrolytes) are, disclosed, for example, in WO2007/093961, where, in Example 1a binary electrolyte A is prepared of 0.2 M $I_2$, 0.5 M NMBI (N-Methylbenzimidazole) and 0.1 M guanidinium thiocyanate (GuNCS) in a mixture of PMII (1-methyl-3-propylimidazolium) iodide and EMITCB (1-ethyl-3-methylimidazolium tetracyanoborate), volume ratio: 13:7).

Yu Bai et al. "High-performance dye-sensitized solar cells based on solvent free electrolytes produced from eutectic melts", Nature materials, Vol. 7, August 2008, 626-629, disclose various mixtures of ionic liquids to obtain a composition of ionic liquids having a melting point below room temperature (25° C.). In particular, various combinations of 1-hexyl-3-methylimidazolium iodide (HMII); 1-butyl-3-methylimidazolium iodide (BMII); 1-propyl-3-methylmidazolium iodide (PMII); 1-ethyl-3-methylimidazolium iodide (EMII); 1,3-dimethylimidazolium iodide (DMII); 1-allyl-3-methylimidazolium iodide (AMII) were prepared. In particular, solvent free melts DMII/EMII/AMII/$I_2$ (v:v:8:8:1) and DMII/EMII/EMITCB/$I_2$ (12:12:16:1.67) were successfully used as electrolyte systems in dye-sensitized solar cells.

Furthermore, similar ionic liquid-based electrolyte systems as claimed and disclosed in the international patent application PCT/IB2008/055507, filed on Dec. 23, 2008, are also encompassed by the present invention.

The layer 6 may also be an electrically conductive charge transport layer, in which electrons and/or holes move by electronic motion, instead of diffusion of charged molecules. Such electrically conductive layers are preferably based on organic compounds, including polymers. Accordingly, layer 6 may be an electron and/or hole conducting material. U. Bach et al. "Solid-state dye-sensitized mesoporous $TiO_2$ solar cells with high photon-to-electron conversion efficiencies", Nature, Vol. 395, Oct. 8, 1998, 583-585, disclose the amorphous organic hole transport material 2,2',7,7'-tetrakis(N,N-di-p-methoxyphenyl-amine)9,9'-spirofluorene (Spiro-OMeTAD) in dye-sensitised solar cells. In WO2007/107961, charge transporting materials, which are liquid at room temperature and their application in dye-sensitized solar cells are disclosed. These materials may be used, for example, for the purpose of the present invention.

Both, said electrolyte layer or charge transport layer may comprise additives for improving the performance of the device, such as dopants in the case of organic charge transporters, and the like.

The invention is illustrated by the Examples below, which are not intended to limit the scope of the invention.

EXAMPLES

Example 1

Synthesis of bis-(3,3-dimethyl-butyl)-phosphinic acid (DINHOP)

To 3,3-dimethylbutene (4.00 g, 47.5 mmol) hypophosphrous acid (aq. 50%) (0.80 g, 11.9 mmol) and di-tert.-butylperoxide (neat, 0.30 g, 2.4 mmol) was added in a Büchi reactor (10 ml), heated to 135° C. and stirred for 22 hours. The reaction mixture was filtered, and the solid was washed thoroughly with water twice, and with a little acetone. Recrystallization from n-hexane yielded 1.01 g (73%) bis-(3,3-dimethyl-butyl)-phosphinic acid. The compound is shown in FIG. 1, compound (46).

1H NMR (CDCL3) d ppm: 0.92 (18H, s), 1.49 (4H, m), 1.64 (4H, m), 9.15 (1H, br)
31P NMR (CDCL3) d ppm: 62.8 (s)
HR-MS m/z 235.1821 (C12H27O2P)

Example 2

Preparation and Modification of $TiO_2$ Surfaces

Two kinds of mesoscopic $TiO_2$ films were used in this study. Film I (transparent film): A 5 μm thick transparent layer of 20 nm $TiO_2$ particles was screen printed on the fluorine-doped $SnO_2$ (FTO) conducting glass electrode. The film I was used in the UV-vis and FTIR spectroscopy measurements. Film II (double layer film): A 7 μm thick transparent layer of 20 nm $TiO_2$ particles was first printed on the FTO conducting glass electrode and then coated with a 5 μm thick second layer of 400 nm light scattering anatase particles. The film II was used to make the devices for the I-V, electrochemical impedance spectroscopy, photoelectrical transient decay and the photovoltaic measurements. The details for the preparation of the $TiO_2$ films have been described by Wang, P.; Zakeeruddin, S. M.; Comte, P.; Charvet, R.; Humphry-Baker, R.; Grätzel, M. J. Phys. Chem. B 2003, 107, 14336.

The $TiO_2$ films were first sintered at 500° C. for 30 min and then cooled to about 80° C. in air. Then, the $TiO_2$ film electrodes were dipped into a 300 mM NaRu(4-carboxylic acid-4'-carboxylate) (4,4'-dinonyl-2,2'-bipyridyl) (NCS)$_2$, (coded Z907Na) solution with and without the co-adsorbent (in this experiment, DINHOP, obtained in Example 1) in a mixture of acetonitrile and tert-butyl alcohol (volume ratio, 1:1) at room temperature for 16 h to adsorb the dye. Thereafter, the modified surfaces were washed with acetonitrile and dried by air flow.

Example 3

Manufacturing of Dye-Sensitized Solar Cells with Modified Photoanode Surface According to the Invention The sensitized titania electrodes obtained in Example 2 were assembled with thermally platinized conducting glass electrodes. The two electrodes (the $TiO_2$ photoanode and a platinized counter electrode) were separated by a 25 μm thick Surlyn hot-melt gasket and sealed up by heating. The internal space was filled with a liquid electrolyte using a vacuum back filling system. The electrolyte-injecting hole made with a sand-blasting drill on the counter electrode glass substrate was sealed with a Bynel sheet and a thin glass cover by heating. The non-volatile electrolyte composition is as follows: 1.0 M 1-propyl-3-methylimidazolium iodide, 0.15 M $I_2$, 0.5 M N-butylbenzimidazole (NBB), and 0.1 M guanidinium thiocyanate (GNCS) in 3-methoxypropionitrile (MPN). In order for comparison, four devices were studied: device A using the bare $TiO_2$ as the anode, device B using the $TiO_2$ coated with the co-adsorbent, device C using the $TiO_2$ coated with Z907Na dye, and device D using the $TiO_2$ co-grafted with Z907Na and DINHOP (molar ratio in the staining solution 1:1).

Example 4

Attenuated Total Reflectance (FTIR (ATR-FTIR) and UV-Vis Spectroscopy Measurements Method and Materials ATR-FTIR spectra were measured using a FTS 7000 FTIR spectrometer (Digilab, USA). The data reported here were taken with the 'Golden Gate' diamond anvil ATR accessory. Spectra were derived from 64 scans at a resolution of 2 cm$^{-1}$. The samples were measured under the same mechanical force pushing the samples in contact with the diamond window. No ATR correction has been applied to the data. It also has to be appreciated that this ATR technique probes at most 1 μm of sample depth and that this depends on the sample refractive index, porosity etc. Some of the spectra show artifacts due to attenuation of light by the diamond window in the 2000 to 2350 cm$^{-1}$ region. Dye coated films were rinsed in acetonitrile and dried prior to measuring the spectra. Electronic absorption spectra were performed on a Cary 5 spectrophotometer.

Results and Conclusions

Figure 7:
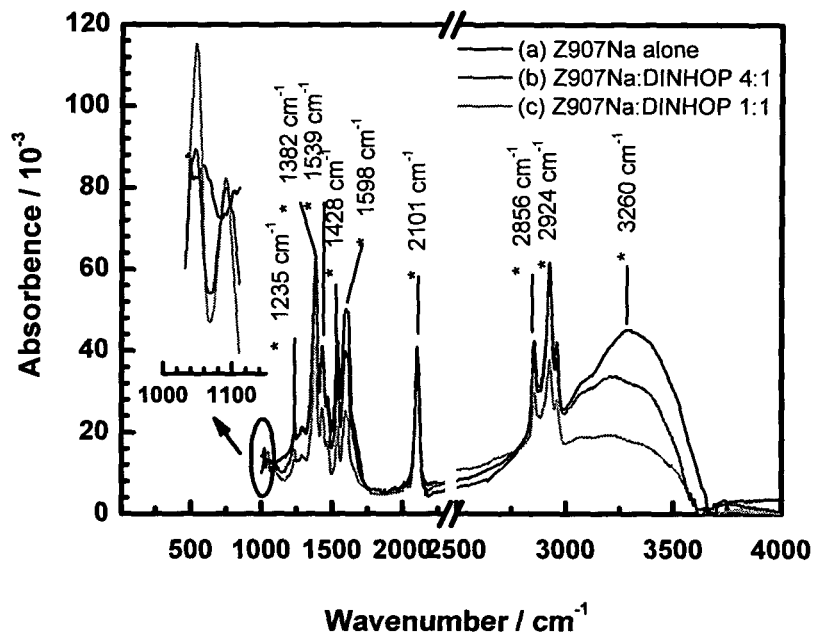
FIG. 7 shows ATR-FTIR spectra of 5 μm $TiO_2$ films (transparent film I) coated with (a) Z907Na alone (black line), (b) Z907Na/DINHOP (bis-(3,3-dimethyl-butyl)-phosphinic acid) (molar ratio in the staining solution 4:1, red line) and (c) Z907Na/DINHOP (molar ratio in the staining solution 1:1, green line), respectively. The inset shows the appearance of the characteristic P—O bonds peaks of DINHOP in the 1050-1110 $cm^{-1}$ range. Note that the presence of DINHOP decreases the intensity of the bands from surface adsorbed water in the region of 3000-3500 $cm^{-1}$.
Figure 8:
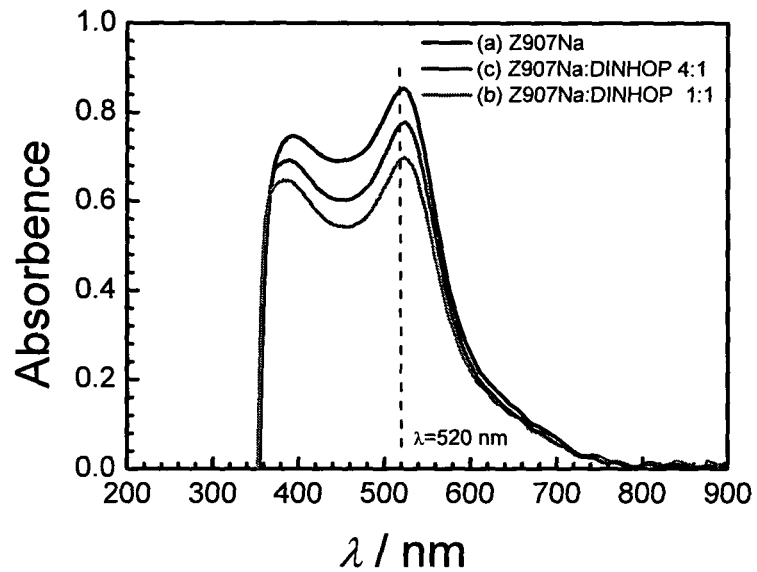
FIG. 8 are UV-vis spectra of 5 μm $TiO_2$ films (transparent film I) coated with (a) Z907Na alone (black line), (b) Z907Na/DINHOP (molar ratio in the staining solution 4:1, red line) and (c) Z907Na/DINHOP (molar ratio in the staining solution 1:1, green line), respectively. The dye loading is 100%, 92% and 82% for Z907Na alone, Z907/DINHOP (4:1) and Z907Na/DINHOP (1:1), respectively, by determining the optical absorption of the film at 520 nm wavelength (λ).

FIG. 7 shows the ATR-FTIR spectra of mesoporous $TiO_2$ electrodes stained with the Z907Na sensitizer alone or together with the co-adsorbent, i.e., DINHOP. In the spectrum (a) of the transparent film coated with Z907Na alone, the single band at 2101 $cm^{-1}$ arises from the ruthenium bound thiocyanato (NCS) group; the bands at 1598 and 1382 $cm^{-1}$ are due to the asymmetric and symmetric stretching modes of carboxylate groups, indicating that the two carboxylic acid groups are deprotonated and involved in the adsorption of the dye on the surface of the $TiO_2$; the peaks at 2924 and 2856 $cm^{-1}$ correspond to the asymmetric and symmetric stretching modes of the $CH_2$ units of the aliphatic chains. The sharp signals located at 1539, 1428 and 1235 $cm^{-1}$ are due to the aromatic modes of bipyridine while the broadband centered at 3260 $cm^{-1}$ is ascribed to the adsorbed water molecules. Spectra (b) and (c) were measured with the transparent $TiO_2$ films coated with Z907Na and co-adsorbent (DINHOP) in a molar ratio of 4:1 and 1:1, respectively. As presented in the inset of FIG. 7, co-grafting of DINHOP is confirmed by the appearance of the P—O stretching bands at 1095 and 1045 $cm^{-1}$. The surface adsorbed water peak at 3260 $cm^{-1}$ was suppressed by DINHOP co-adsorption, indicating that access of water to the surface of the anatase nanocrystals is much more restricted in the case of the mixed monolayer than for the amphiphilic Z907Na dye alone. Alkylphosphonic acids are known to strongly bind to the oxide surfaces through formation of P—O-metal bonds, eliminating that most of hydrophilic surface sites that remain available for water adsorption even after grafting of the Z907Na dye. Changing the dye to DINHOP ratio from 4:1 to 1:1, resulted in a net increase in band intensity at 1045 $cm^{-1}$ (in spectrum c) principally due to a higher DINHOP concentration on the $TiO_2$ surface.

By monitoring the peak intensity at 1539 and 2101 $cm^{-1}$, we observe that the dye concentration on the $TiO_2$ surface was reduced by increasing the concentration of DINHOP in the dying solution. This result was further confirmed by measuring the UV-vis spectra of the transparent $TiO_2$ films (film I) co-adsorbed with Z907Na and DINHOP (FIG. 7) at various molar ratios and monitoring the metal-to-ligand charge transfer transitions (MLCT, $d\pi \rightarrow d\pi^*$) at 520 nm. It was found that the dye loading on the $TiO_2$ surface decreased upon increasing the concentration of DINHOP in the dye solution, i.e., the dye loading changing from 100%, 92% to 82% for (a) Z907Na alone, (b) Z907/DINHOP (4:1) and (c) Z907Na/DINHOP (1:1), respectively. The decrease in the concentration of dye on the surface of $TiO_2$ was due to the competition of DINHOP adsorption with dye.

DINHOP binds to titanium ions via the phosphinate group and this binding is much stronger than that of aliphatic carboxylic acids, which forebodes well for the long term stability of DSC's employing phospinates as anchoring group for sensitizers or co-adsorbents. The two neohexyl substituents attached to the phosphinic acid serve as insulators and hydrophobic umbrellas protecting the $TiO_2$ surface from being approached by water and the oxidized form of the redox mediator, i.e., tri-iodide ions. This should reduce the rate of recombination of the conduction band electrons injected by the photo-excited sensitizer into the titania nanoparticles with the triiodide ions. If so, one would expect DINHOP to increase the open circuit voltage of the DSC, as the suppression of the dark current allows higher electron concentrations to be reached in the film under illumination, which in turn shifts their quasi-Fermi level upward, toward more negative electrochemical potentials (vs. NHE). These expectations are born out by the experiments reported here.

Example 5

Electrical Impedance Spectroscopy (EIS) Measurements

Method and Material

Electrochemical impedance spectroscopy (EIS) was employed to scrutinize the effect of DINHOP on the dark current, generated under forward bias at the $TiO_2$ nanocrystal/electrolyte junction through the reduction of tri-iodide ions by conduction band electrons. Electrical impedance spectra of the DSCs of Example 3 were measured using the PGSTAT 30 frequency analyzer from Autolab (Eco Chemie B.V, Utrecht, The Netherlands) together with the Frequency Response Analyzer module providing voltage modulation in the desired frequency range. The Z-view software (v2.8b, Scribner Associates Inc.) was used to analyze the impedance data. The EIS experiments were performed at a constant temperature of 20° C. in the dark. The impedance spectra of the DSC devices were recorded at potentials varying from −0.8 V to −0.45 V at frequencies ranging from 0.05 Hz to ~1 MHz, the oscillation potential amplitudes being adjusted to 10 mV. The photoanode ($TiO_2$) was used as the working electrode and the Pt counter electrode (CE) was used as both the auxiliary electrode and the reference electrode.

Results and Conclusion

Figure 9:
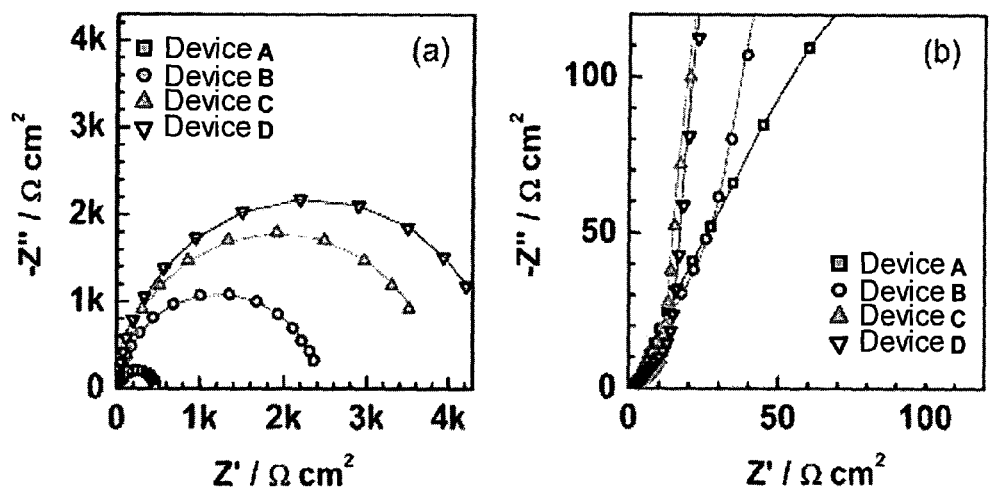
FIG. 9 (A) (a) shows impedance spectra (Nyquist plot) of the different devices at forward bias of −0.525 V under dark conditions: device A, the bare $TiO_2$; device B, the $TiO_2$ coated with DINHOP; device C, the $TiO_2$ sensitized with Z907Na; device D, the $TiO_2$ co-sensitized with Z907Na/DINHOP (molar ratio 1:1). The solid line corresponds to derived values using the fitting model described in text. The electrolyte composition is as follows: 1.0 M PMII, 0.15 M $I_2$, 0.5 M NBB, and 0.1 M GNCS in 3-methoxypropionitrile (MPN). (b) The enlarged part of plot (a) in the high frequency range FIG. 9 (B) shows electron transport resistance $R_t$ in the $TiO_2$ film obtained from impedance measurements in the dark at 20° C. as a function of applied forward bias voltage. The lines plotted in the figure are guides to the eye.
Figure 9:
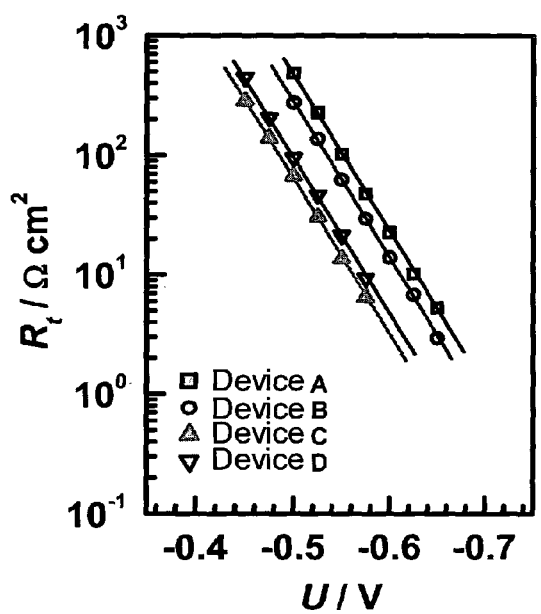

FIG. 9A compares the Nyquist plot of device A (a bare nanocrystalline $TiO_2$ film) with that modified electrode with self-assembled molecular DINHOP layer (device B), a sensitizer Z907Na monolayer (device C) and a mixed monolayer (Z907Na/DINHOP molar ratio 1:1, device D). The impedance data in FIG. 9A were measured at forward bias of −0.525 V under dark conditions and 20° C. in presence of iodide/tri-iodide redox electrolyte. In those conditions, we observed that the adsorption of DINHOP enlarges dramatically the radius of the semicircle (related to the interface recombination between the $TiO_2$ conduction band electrons and $I_3^-$ in the electrolyte) at low frequencies range (from 200 Hz to 1 Hz) in the Nyquist plot (device B, FIG. 9A) compared to that of the bare nanocrystalline $TiO_2$ film (device A, FIG. 9A), indicating a pronounced reduction in the dark current. The $TiO_2$ nanocrystalline film with co-grafting of Z907Na/DINHOP (molar ratio 1:1, device D) shows the biggest radius of the semicircle at the low frequencies range. The corresponding position of the phase angle maximum in the Bode plot shows a large shift towards lower frequency (not shown), revealing an increase in the apparent recombination lifetime ($\tau_n$) at forward bias of −0.525 V from 38 ms (device A) to 254 ms (device B), 607 ms (device C), and 622 ms (device D). The direct electrochemical measurement of the dark current under forward bias confirms the surface passivating effect exerted by DINHOP (not shown) of the supplementary section. These results indicate that a better surface passivation through diminishment of recombination as well as the formation of an insulating barrier is occurring in the case of Z907Na/DINHOP (compared to that of Z907Na alone), thus enhancing the electron transport across the nanocrystalline $TiO_2$ film.

The EIS spectra of devices C (sensitized with Z907Na) and D (co-grafted with Z907Na and DINHOP) in the inset in FIG. 9A present smaller electron transport resistances ($R_t$) for electrons in the $TiO_2$ at high frequencies range (from 10 KHz to 200 Hz) than that for the bare $TiO_2$ (device A). These spectra follow well a transmission line behavior, which was described according to the model suggested by Bisquert et al. *J. Phys. Chem. B* 2004, 108, 8106. Under forward bias, electrons are transferred from the FTO substrate into the $TiO_2$ film, allowing electron propagation through its individual particles with the resistance $R_t$. Considering the whole mesoscopic $TiO_2$ film as an interconnected network, it must be emphasized that, in a multiple trapping scheme, the electronic transport resistance is independent of the number of traps. This is because the electron transport resistance relates only to the steady-state transport and reflects the rate of displacement in the transport band. Any $TiO_2$ conduction band edge movement induced by the DINHOP and/or Z907Na adsorption can be inferred from tracing the electronic transport resistance ($R_t$) in the nanocrystalline titania film (Bard, A. J.; Faulkner, L. R. *Electrochemical methods Fundamentals and Applications* (second edition) 2004, 102). The resistance ($R_t$) is inversely proportional to the concentration of electrons at the transport level, which in turn depend exponentially on the difference in the position of the Fermi energy level ($E_{Fn}$) and the conduction band edge ($E_C$) of the semiconductor, as expressed by $$R_t = R_0 \exp\left(-\frac{E_{Fn} - E_C}{k_B T}\right) \quad (1)$$

$$= R_0 \exp\left(-\frac{E_{Fp} - E_C}{k_B T}\right) \exp\left(-\frac{E_{Fn} - E_{F,p}}{k_B T}\right)$$

where $E_{Fp}$ is the Fermi energy level of the redox couple in the electrolyte (in these experiments, $I^-/I_3^-$). The pre-exponential term $R_0$ remains essentially constant for all of the devices provided that their geometrical dimensions are similar and that $E_F \ll E_C$, conditions which are fulfilled.

FIG. 9B presents the variation of $R_t$ under dark conditions in the mesoscopic $TiO_2$ films. $R_t$ exhibits the expected exponential behaviour, the bare $TiO_2$ (device A) giving much higher $R_t$'s when compared to the $TiO_2$ films grafted with DINHOP (device B) and Z907Na/DINHOP (device D) at the same bias voltage. The device C (the $TiO_2$ films sensitized with Z907Na) shows the smallest $R_t$ values. The electron transfer resistance, which is dependent on the free electrons ($n_c$) in the conduction band, shows parallel behaviour for various devices, implying that the shift of the resistances for the steady state electron transport amongst those devices are caused by the position of the Fermi level of the electrons ($E_{Fn}$) with respect to the conduction band edge ($E_C$). As the Fermi level in the nanocrystals is adjusted by the applied bias voltage U (in the dark measurement conditions $U = E_{Fn} - E_{Fp}$), a shift in the conduction band edge ($E_C$) reveals itself by a displacement of the log $R_t$ vs. U plot. Using equation 1, we determine the $TiO_2$ conduction band edge energy level shift relative to the $E_{Fp}$ from the postulated point of intersection of the calculated $R_t$ line on the abscissa's (applied voltage) scale by extending formally to $R_t$ values of close to 0.1 $\Omega cm^2$, giving a good estimation of $R_0$ in the equation corresponding to the resistance of a titania film at which the $E_{Fn}$ approaches the same level as the $E_C$. FIG. 9B illustrates that there is a small downward shift of the conduction band edge by about 20 mV for the device B (the $TiO_2$ surface modified with DINHOP) compared to that of the device A (the bare $TiO_2$). This arises from protonation of the titania surface by the phosphinic acid anchoring group. As a result, the concentration of conduction band electrons at a given forward bias voltage is higher for the DINHOP derivatized film than bare titania. This should increase the rate of electron transfer to the tri-iodide ions. However, the blocking action of DIN-HOP's alkyl chains clearly overcompensates this increase of rate, resulting in a net retardation of the dark current (as discussed below).

Figure 10:
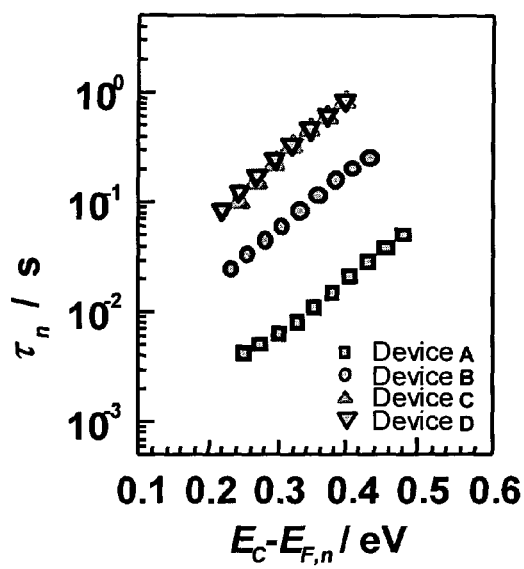
FIGS. 10 (a) and (b) show derived recombination/electron diffusion parameters from impedance measurements under dark conditions for four different devices: device A, the bare $TiO_2$; device B, the $TiO_2$ coated with DINHOP; device C, the $TiO_2$ sensitized with Z907Na; device D, the $TiO_2$ co-sensitized with Z907Na/DINHOP (molar ratio 1:1). The electrolyte composition is as follows: 1.0 M PMII, 0.15 M $I_2$, 0.5 M NBB, and 0.1 M GNCS in MPN. FIG. (a) shows recombination lifetime (τ″) and FIG. (b) effective electron diffusion length ($L_e$) as a function of electron Fermi level offset ($E_C$−$E_{F,n}$).
Figure 10:
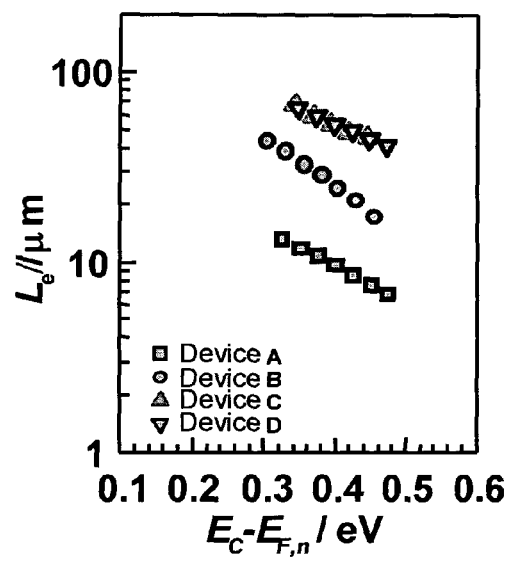

In order to compare the recombination lifetime ($\tau_n$, $\tau_n = R_{ct} C_\mu$, $R_{ct}$ being the recombination resistance, $C_\mu$ being the chemical capacitance) with and without DINHOP surface modification for equal electron concentrations in the titania nanoparticles, the plot in FIG. 10a uses the difference between the conduction band edge and the Fermi level ($E_C - E_{Fn}$) as abscissa instead of the applied bias voltage (U). The recombination resistance ($R_{ct}$) and chemical capacitance ($C_\mu$) were obtained by fitting the impedance data with the transmission line model. Strikingly, the DINHOP derivatized $TiO_2$ electrode (device B) shows close to ten times longer $\tau_n$ than the bare film (device A). This demonstrates that the interfacial recombination between the electrons in the conduction band of the $TiO_2$ and the tri-iodide ions in the electrolyte is strongly retarded by the self-assembled DINHOP monolayer. FIG. 10b shows that this results in a nearly fivefold increase of the conduction electron diffusion length (L) for device B than that of device A, which greatly benefits the charge carrier collection in dye sensitized solar cells.

Example 6

Photovoltaic Characterisation of the Devices Made in Example 3

Method and Materials

A 450 W xenon light source (Oriel, USA) was used to give an irradiance of 100 mW cm$^{-2}$ (the equivalent of one sun at air mass (AM) 1.5) at the surface of the solar cells. The spectral output of the lamp was matched in the region of 350-750 nm with the aid of a Schott K113 Tempax sunlight filter (Präzisions Glas & Optik GmbH, Germany) so as to reduce the mismatch between the simulated and true solar spectra (less than 2%). Various incident light intensities were regulated with wavelength neutral wire mesh attenuators. The current-voltage characteristics of the cell under these conditions were obtained by applying external potential bias to the cell and measuring the generated photocurrent with a Keithley model 2400 digital source meter (Keithley, USA).

Results

Figure 11:
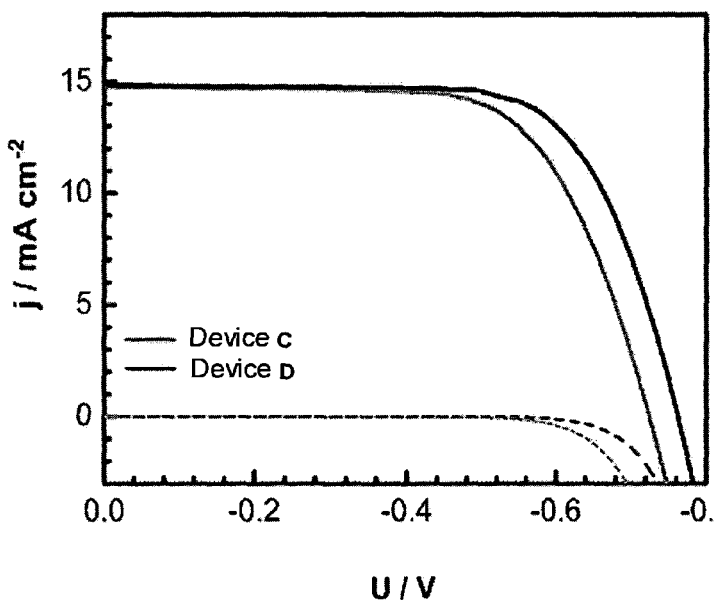
FIGS. 11 (a) and (b) show.
Figure 11:
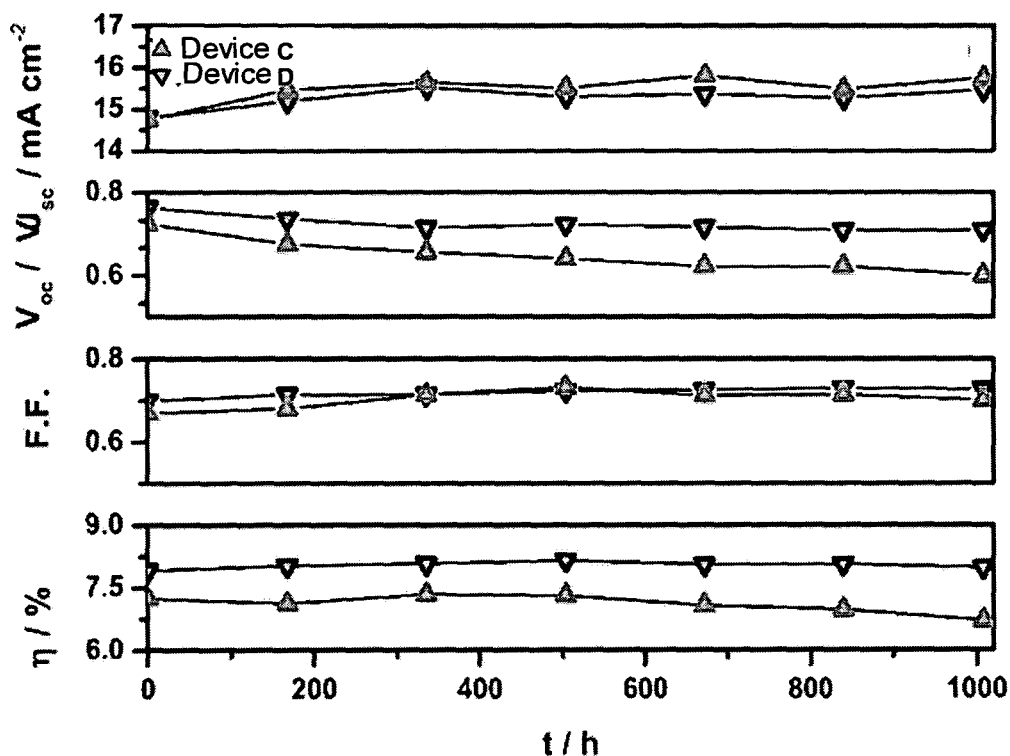
Figure 12:
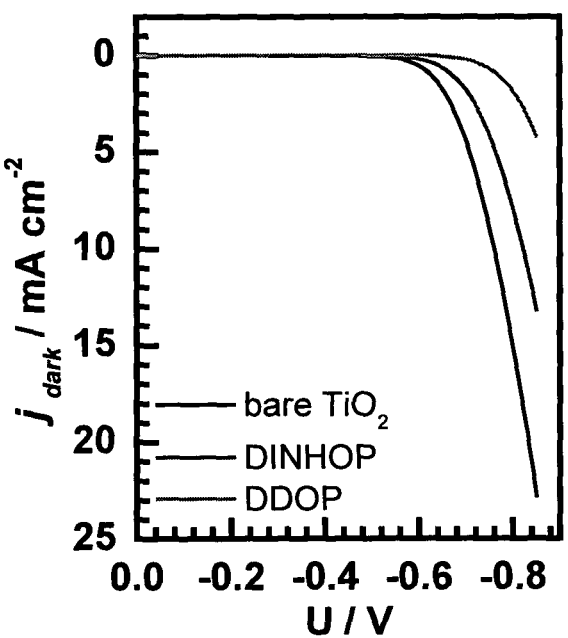
FIG. 12 shows dark current-voltage characteristics of mesoscopic $TiO_2$ electrodes in sandwich type cells with and without phosphinic acid molecule. The counter electrode was Pt-coated FTO. The adsorbed molecules are DINHOP or DDOP (bis-(dodecyl)-phosphinic acid).

FIG. 11a presents the photocurrent-voltage curves of the different DSCs sensitized with Z907Na dye alone (device C) and with DINHOP as the co-adsorbent (molar ratio 1:1, device D) measured under AM 1.5 full sunlight (intensity of the solar simulator 100 mW cm$^{-2}$, spectral mismatch corrected). The photovoltaic parameters, i.e., the open circuit voltage ($V_{OC}$), fill factor (FF), short circuit current density ($J_{SC}$) and the photovoltaic conversion efficiency ($\eta$) for devices C and D are tabulated in Table 1 below. As for the device C (Z907Na alone), the $J_{SC}$, $V_{OC}$, and FF are 14.74 mA/cm$^{-2}$, 725 mV, and 0.67, respectively, yielding an overall conversion efficiency ($\eta$) of 7.2%. It is interesting to find that using DINHOP as co-adsorbent along with Z907Na (device D) improves the $V_{OC}$ by 38 mV. Although a certain amount of dye is replaced by the co-adsorbent (determined by the UV-vis spectroscopy measurements), a small increase in $J_{SC}$ was observed. The corresponding parameters ($J_{SC}$, $V_{OC}$, FF, and $\eta$) of device D are 14.8 mA cm$^{-2}$, 763 mV, 0.70 and 7.9%, respectively.

TABLE 1

Photovoltaic parameters of devices under AM1.5 full sunlight illumination: device C, the TiO$_2$ sensitized with Z907Na; device D, the TiO$_2$ co-sensitized with Z907Na/DINHOP (molar ratio 1:1).

| Device | Adsorption condition | $J_{SC}$ mA cm$^{-2}$ | $V_{OC}$ mV | F.F. | η % |
|---|---|---|---|---|---|
| C | Z907Na | 14.74 | 725 | 0.67 | 7.24 |
| D | Z907Na/DINHOP | 14.8 | 763 | 0.70 | 7.91 |

EIS was further used to understand the striking differences in photovoltaic behavior of devices with and without the DINHOP co-adsorbent. In the case of the Z907Na grafted TiO$_2$ film (device C), a downward shift of the conduction band edge energy level ($E_c$) with respect to the Fermi level ($E_{Fp}$) of the redox couple of approximately 81 mV was observed compared to the bare TiO$_2$ (device A) in the same electrolyte. A 52 mV downward shift of $E_c$, relative to the bare TiO$_2$, was seen for the Z907Na/DINHOP co-grafted TiO$_2$ film (device D). The shift of the conduction band edge between devices C and D, thus, was determined to be 29 mV. Consequently, we expected that the TiO$_2$ film derivatized with the mixed monolayer delivers a higher photovoltage than the film containing Z907Na dye alone, which is in good agreement with the photovoltaic results (Table 1), showing that device D has a higher open circuit voltage value than that of device C. The device D shows a slightly longer recombination life time ($\tau_n$) than device C at a given electron energy level offset as illustrated in FIG. 10a, more supporting evidence for a slower charge recombination occurring in this device relative to the others, thus, an increase electron diffusion length ($L_e = d\sqrt{R_{ct}/R_t}$, d being the film thickness) can be achieved in device D (FIG. 10b). As the dilution of the Z907Na dye by the DINHOP co-adsorbent decreases the light harvesting at least for transparent nanocrystalline films, one wonders why this does not reduce the photocurrent. Likewise, the upward shift (29 mV) of the conduction band edge (FIG. 10b) for the device D relative to device C would be expected to increase the rate of recombination because the driving force for recombination is determined by the difference between the electron Fermi level and the electrochemical potential of the electrolyte. These contrasting effects can be explained by the DINHOP co-adsorbent's simultaneous enhancement of the surface passivation (lowered recombination), its blocking layer formation, and it's enhancing of the conduction band energy level due to its molecular properties. This has been mentioned in the literatures, and we have confirmed that co-grafting of dyes with amphiphilic molecules containing carboxylate or phosphonate groups enhances the efficiency of the DSCs (WO2004097871). As indicated in the impedance measurements along with I-V data, the net increase of $V_{OC}$ as a result of both band-edge movement and surface shielding was more than 38 mV and that the co-adsorption advanced the effect of band-edge movement on $V_{OC}$ by more than 9 mV. Thus, the collection efficiency of photo generated carriers is increased by DINHOP and that the use of the light scattering particles layer benefits device D more so than that of device C. Neale et al.; *J. Phys. Chem. B* 2005, 109, 23183, have studied the effect of the co-adsorbent, i.e., tetrabutylammonium chenodeoxycholate, on the performance of DSCs, and found that adding chenodeoxycholate reduces the dye loading significantly but has only a modest effect on $J_{SC}$. Transient photovoltage decay measurements confirmed that the presence of DINHOP retards the interfacial electron recombination with tri-iodide (not shown) these results are consistent with the above findings from the EIS study.

Example 7

Stability Tests

Materials and Method

The long term stability of the devices was tested by subjecting them to light soaking at 60° C. under full sunlight intensity. Hermetically sealed cells employing film II (7+5 μm) were used to monitor the long-term stability under visible-light soaking at 60° C. A 50 μm thick polyester film (Preservation Equipment Ltd, UK) was used as a UV cutoff filter (below 400 nm). Cells were exposed at open circuit to a Suntest CPS plus lamp (ATLAS GmbH, 100 mW cm$^{-2}$, 60° C.) over 1000 hours. The cells were taken out every week to check the I-V performance.

Results and Conclusion

MPN (3-methoxyproprionitrile) based electrolyte were used in the devices for its high boiling point, low volatility, non-toxicity, and good photochemical stability. As shown in FIG. 11b, device D exhibited an excellent stability. Even after the 1,000 h aging test, there was practically no change in the device efficiency, only a drop of 50 mV in $V_{OC}$ being compensated by an increase in the $J_{SC}$ values. As we did not observe any change in the diffusion and redox over-potentials of electrolytes on the platinized counter electrode, the decrease of $V_{OC}$ should be mainly related to the surface state variation of the mesoporous film, probably caused by that protons in the electrolyte slowly replace the surface adsorbed guaninium and/or imidazolium cations. The $V_{OC}$ drop could be attenuated by our previously developed co-grafting protocol to improve the compactness of the hydrophobic monolayer on the titania surface. We are now systematically optimizing the molecular structure of co-adsorbent with phosphinate anchoring group to further enhance the performance and stability of DSCs.

Example 8

Use of Phosphinic Acid Compounds as Anticorrosion Agents

Dark current-voltage characteristics were determined of the three kinds of mesoscopic-TiO$_2$ electrodes with and without phosphinic acid adsorbed. To adsorb the phosphinic acid on the surface, the TiO$_2$ films were first sintered at 500° C. for 30 min and then cooled to about 80° C. in air. Then, the TiO$_2$ film electrodes were dipped into a 300 mM DINHOP or DDOP solution in a mixture of acetonitrile and tert-butyl alcohol (volume ratio, 1:1) at room temperature for 16 h. Thereafter, the modified surfaces were washed with acetonitrile and dried by air flow. The cells were assembled with thermally platinized conducting glass electrodes. The two electrodes (the TiO$_2$ modified with phosphinic acid and a platinized counter electrode) were separated by a 25 μm thick Surlyn hot-melt gasket and sealed up by heating. The internal space was filled with a liquid electrolyte using a vacuum back filling system. The electrolyte-injecting hole made with a sand-blasting drill on the counter electrode glass substrate was sealed with a Bynel sheet and a thin glass cover by heating. The non-volatile electrolyte composition is as follows: 1.0 M 1-propyl-3-methylimidazolium iodide, 0.15 M I$_2$, 0.5 M N-butylbenzimidazole (NBB), and 0.1 M guanidinium thiocyanate (GNCS) in 3-methoxypropionitrile (MPN).

The onset of the dark current of bare TiO$_2$ occurred at low forward bias. Adsorbing DINHOP or DDOP (didodecylphosphinic acid) molecule on the surface of TiO$_2$ suppresses the dark current, shifting its onset by several hundred millivolts. This indicates that the triiodide reduction at the exposed part of FTO is responsible for the high dark current observed with the bare TiO$_2$ film. The adsorption of phosphinic acid molecules can efficiently serve as anticorrosion coating.

Example 9

Preparation of 2,2'-bipyridin-4-yl(isopentyl)phosphinic acid

Figure 13:
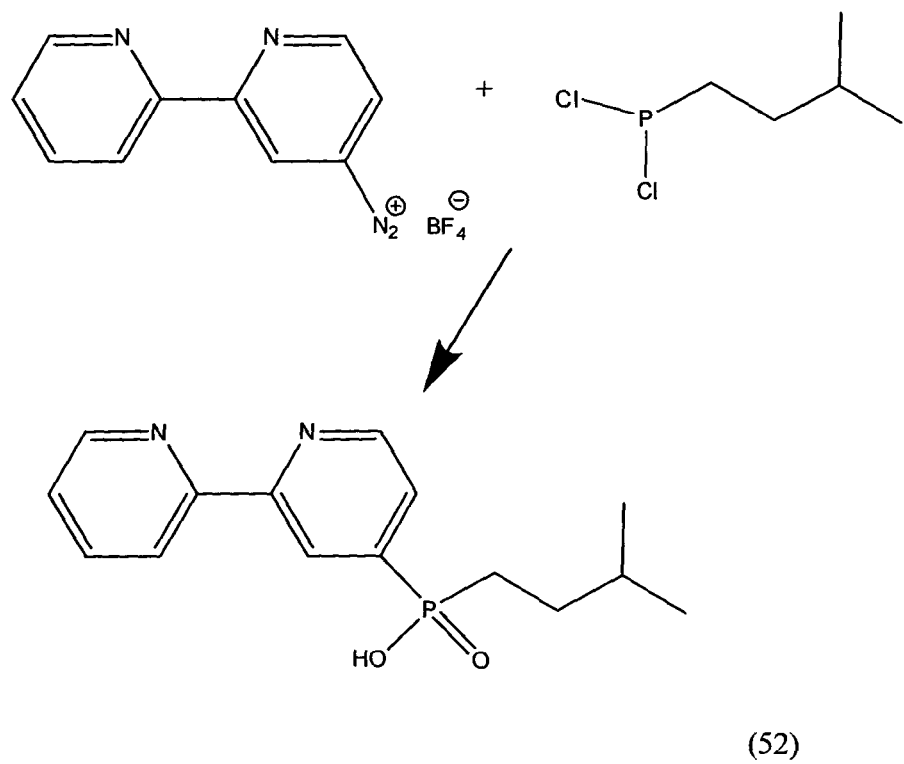
FIG. 13 is a scheme illustrating exemplary synthetic for compounds of the invention, in particular for anchoring ligands having two different substituents, such as of organic dyes and compacting compounds on phosphorous atom of the phosphinic acid. Compound (52) may be used as compacting compound on photoelectrode of solar cell and as a coordinating ligand of sensitizer Z1010 of DSC.

The 2,2'-bipyridin-4-yl(isopentyl)phosphinic acid was prepared applying a modified procedure of G. O. Doak, Leon D. Freedman, J. Am. Chem. Soc., 1951, 73, 5656-5657. 4-Amino-2,2'-bipyridine was prepared according to M. Sprecher et al., Org. Prep. Proced. Int., 1994, 25, 696-701 and diazotized to 4-diazonium-2,2'-bipyridine tetrafluoroborate applying a procedure as written by A. Roe in Organic reactions Vol. 5, Wiley, 1949, p. 193. The 4-diazonium-2,2'-bipyridine tetrafluoroborate (10 mmole) was added to 13 ml isopropylacetate in a 3-necked flask, equipped with a stirrer, a gas outlet tube connected to a water-trap, and a thermometer. Stirring was begun and then dichloro(isopentyl)phosphine (10 mmole) and of copper(I)bromide (1.4 mmole) were added. Stirring continued and the reaction was controlled by external heating and/or cooling. When the gas evolution ceased, the thermometer was changed to a dropping funnel and 2.5 ml. of water was added drop wise to the stirred solution with external cooling of the flask. The reaction mixture was then steam distilled (50 ml of distillate had been collected). The residual liquid in the flask was then transferred to a beaker and evaporated on a steam-bath in a hood to approximately 10 ml. The 2,2'-bipyridin-4-yl(isopentyl) phosphinic acid crystallized when the solution was cooled. The crude acid was removed by filtration and dissolved in 10% sodium hydroxide solution. The alkaline solution was treated with charcoal, filtered, and the acid reprecipitated by the addition of concentrated hydrochloric acid. The 2,2'-bipyridin-4-yl(isopentyl)phosphinic acid was purified by recrystallization from aqueous ethanol (440 mg, 15%). The compound is shown in FIG. 13, compound (52).

For C15H19N2O2P Calculated: H, 6.60; C, 62.06; N, 9.65; P, 10.67. Found: H, 6.74; C, 62.21; N, 9.83; P, 10.48.

Example 10

Synthesis of Z1010 Dye

Figure 14:
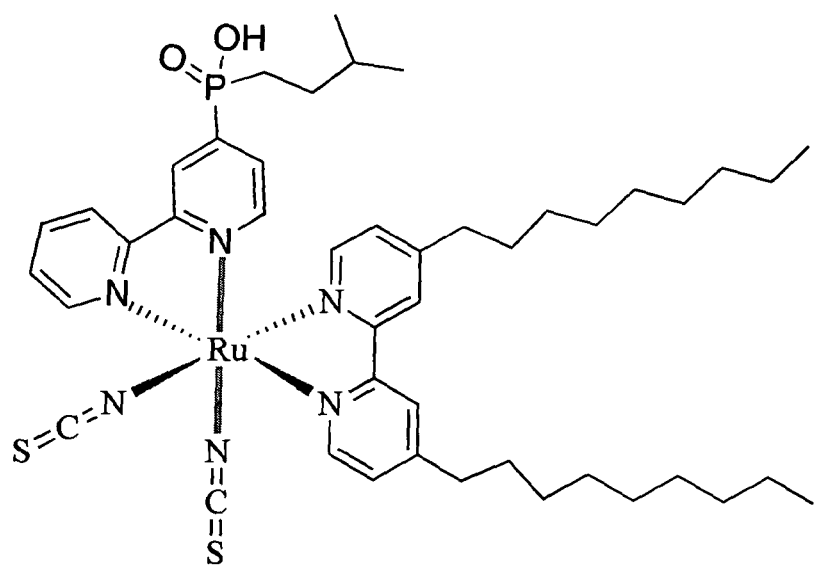
FIG. 14 shows Z1010 dye comprising the compound (52) according to the invention.

The synthesis of Z1010 was performed according to a one pot synthesis method reported in JACS 2004. [RuCl$_2$(p-cymene)]$_2$ (0.15 g, 0.245 mmol) was dissolved in DMF (50 ml) and to this solution 4,4'-dinonyl-2,2'-bipyridine ligand (0.2 g, 0.49 mmol) was added. The reaction mixture was heated to 60° C. under nitrogen for 4 h with constant stirring. To this reaction flask 2,2'-bipyridin-4-yl(isopentyl)phosphinic acid (0.142 g, 0.49 mmol) ligand was added and refluxed for 4 h. Finally, excess of NH$_4$NCS (13 mmol) was added to the reaction mixture and continued the reflux for another 4 h. The reaction mixture was cooled down to room temperature and the solvent was removed by using rotary-evaporator under vacuum. Water was added to the flask and the insoluble solid was collected on a sintered glass crucible by suction filtration. The crude complex was dissolved in a basic methanol solution and purified by passing through a Sephadex LH-20 column with methanol as an eluent. After collecting main band and evaporating the solvent, the resultant solid was redissolved in methanol. Lowering the pH to 3.2 by titration with dilute nitric acid produced Z1010 as a precipitate. The final product was washed thoroughly with water and dried under vacuum. The Z1010 dye is shown in FIG. 14.

Example 11

Manufacturing of Dye-Sensitized Solar Cells with Modified Photoanode Surface According to the Invention and Photovoltaic Performance of Z1010 Sensitized Solar Cells A screen-printed double layer of TiO$_2$ particles was used as photoanode. A 10 µm thick film of 20 nm sized TiO$_2$ particles was first printed on the fluorine-doped SnO$_2$ conducting glass electrode and further coated by 4 µm thick second layer of 400 nm sized light scattering anatase particles. Fabrication procedure for the nanocrystalline TiO$_2$ photoanodes and the assembly as well as photoelectrochemical characterization of complete, hot-melt sealed cells has been described by P. Wang et al. (J. Phys. Chem. B, 2003, 107, 14336-14341). The electrolyte used for device E contained 1.0 M 1-3-dimethylimidazolium iodide (DMII), 30 mM I$_2$, 0.1 M guanidinium thiocyanate, and 0.5 M 4-tert-butylpyridine in the 85%:15% (v/v) mixture of acetonitrile and valeronitrile. The TiO$_2$ electrodes were immersed at room temperature for 12 h into a solution containing 300 µM Z1010 in acetonitrile and tert-butanol (volume ratio: 1:1). For stability tests, the electrolyte was composed of 1.0 M DMII, 0.1 M I$_2$, 0.1 M guanidinium thiocyanate and 0.5 M N-butylbenzimidazole in 3-methoxypropionitrile and the corresponding device is denoted as device F.

Results and Conclusion

The incident photon to current conversion efficiency (IPCE) of device E using sensitizer Z1010 and volatile electrolyte exceeds 80% in a spectral range from 470 to 620 nm, reaching its maximum of 87% at 520 nm. Considering the light absorption and scattering loss by the conducting glass, the maximum efficiency for absorbed photon to current conversion efficiency is practically unity over this spectral range. From the overlap integral of this curve with the standard global AM 1.5 solar emission spectrum, a short-circuit photocurrent density (Jsc) of 17.0 mA·cm$^{-2}$ is calculated, which is in excellent agreement with the measured photocurrent. As shown in Table 2, its short-circuit photocurrent density (Jsc), open-circuit photovoltage (Voc), and fill factor (ff) of device E with Z1010 dye under AM 1.5 full sunlight are 17.0 mA·cm$^{-2}$, 720 mV, and 0.7, respectively, yielding an overall conversion efficiency (η) of 8.6%.

Figure 15:
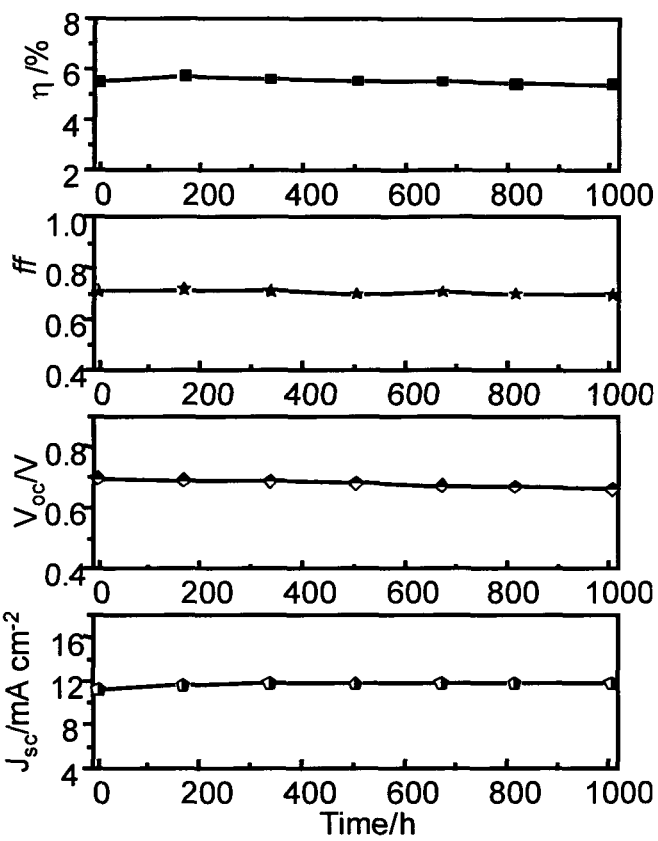
FIG. 15 shows photovoltaic parameters of device E during successive one sun visible-light soaking at 60° C.

The above-mentioned 3-methoxypropionitrile based electrolyte was used for the stability test of sensitizer Z1010 under thermal stress and visible light soaking. The advantage of using 3-methoxypropionitrile lies in its high boiling point, low volatility, non-toxicity and good photochemical stability, making it viable for practical application. Photovoltaic parameters (Jsc, Voc, ff, and η) of device F are 12.1 mA cm-2, 700 mV, 0.72, and 6.1%, respectively. The cells covered with a 50 µm thick of polyester film (Preservation Equipment Ltd, UK) as a UV cut-off filter (up to 400 nm) were irradiated at open circuit under a Suntest CPS plus lamp (ATLAS GmbH, 100 mW·cm$^{-2}$, 55° C.). As shown in FIG. 15, all parameters of the device are rather stable during 1000 h accelerating test.

The dye molecules of the present invention strongly absorbed on the TiO$_2$ exhibit a red shift in the spectral response. This substantial increase in the red shift could not be expected from the light absorption spectrum of the dyes in solution. It is also derived that dye molecules are particularly densely arranged on the semiconductor surface. In conclusion, without wishing to be bound by theory, the dyes of the present invention, when absorbed on the surface of TiO$_2$, could promote a dense self-assembly of dye molecules due to the presence of amphiphilic alkyl chain on the phosphorous atom of phosphinic acid. The phosphinic acid anchoring group strongly binds to the surface of semiconductor to enhance the device durability.

TABLE 2

Photovoltaic device parameters under AM 1.5 full sunlight illumination of device E using TiO$_2$ sensitized with Z1010 and volatile electrolyte and of device F using 3-methoxypropionitrile based electrolyte.

| Device | Dye | $V_{OC}$ mV | $J_{SC}$ mA cm$^{-2}$ | F.F. ff | η (%) |
|---|---|---|---|---|---|
| E | Z1010 | 720 | 17.0 | 0.70 | 8.6 |
| F | Z1010 | 700 | 12.1 | 0.72 | 6.1 |

One of the advantages of the compound of formula (1) is that two different ligands, such as chromophore can be coupled on the same phosphorous atom of phosphinic acid to synthesize two dyes coupled together. As a consequence, broad absorption spectra in the visible and near infra red region can be achieved and most of the solar energy can thus be harnessed. These two dyes could be both metal complexes, or one metal complex and one metal free dye, or both metal free dyes. The use of these types of panchromatic dyes will greatly improve the performance of the devices at the same time without impeding the durability.

Example 12

Synthesis of 5'-(4-(bis(4-methoxyphenyl)amino) phenyl)-3,4'-dihexyl-2,2'-bithiophen-5-yl(butyl) phosphinic acid (54)

The 5'-(4-(bis(4-methoxyphenyl)amino)phenyl)-3,4'-dihexyl-2,2'-bithiophen-5-yl(butyl)phosphinic acid was prepared applying a modified procedure of Y. Xu et al., Synthesis, 1984, 778. 4-(5'-Bromo-3',4-dihexyl-2,2'-bithiophen-5-yl)-N,N-bis(4-methoxyphenyl)aniline (216 mg, 0.8 mmol) was placed in a Schlenck tube, and toluene (0.2 ml), ethyl butylphosphinate (152 mg, 0.88 mmol), triethylamine (0.36 ml, 2.6 mmol), and tetrakis[triphenylphosphine]palladium (46.2 mg, 0.04 mmol) was added under a stream of argon, stoppered, and heated in an oil bath at 110° C. for 10 h. After the mixture has been cooled, ethyl acetate (5 ml) is added and the solid is removed by filtration. The filtrate is concentrated on a rotatory evaporator and the residue is purified by column chromatography on silica gel eluting with petroleum ether (bp. 60-90° C.)/ethyl acetate. The ester thus obtained was hydrolised with 12% aqueous HCl (2×2 mL) evaporating to dryness on a waterbath yielding 5'-(4-(bis(4-methoxyphenyl) amino)phenyl)-3,4'-dihexyl-2,2'-bithiophen-5-yl(butyl) phosphinic acid (190 mg, 82%).

For C44H56N1O4P1S2 Calculated: H, 7.45; C, 69.72; N, 1.85; P, 4.09 S, 8.46. Found: H, 7.32; C, 69.60; N, 1.75; P, 4.36; S, 8.52.

Example 13

Manufacturing of Dye-Sensitized Solar Cells with Modified Photoanode Surface According to the Invention and Photovoltaic Performance of 54 Dye Sensitized Solar Cells The fabrication procedure is as explained in example 11. The device prepared with electrolyte containing 1.0 M 1-3-dimethylimidazolium iodide (DMII), 30 mM I$_2$, 0.1 M guanidinium thiocyanate, and 0.5 M 4-tert-butylpyridine in the 85%:15% (v/v) mixture of acetonitrile and valeronitrile is denoted as G. The device prepared with electrolyte containing 1,3-dimethylimidazolium iodide/1-methyl-3-ethyl imidazolium iodide/1-methyl-3-ethyl imidazolium tetracyanoborate/iodine/n-butylbenzimidazole/guanidinium thiocyanate in molar ratio of 12/12/16/1.67/3.33/0.67, respectively is denoted as device H Results and Conclusion The incident photon to current conversion efficiency (IPCE) of device G using sensitizer 54 and volatile electrolyte exceeds 75% in a spectral range from 450 to 600 nm, reaching its maximum of 80% at 500 nm. Considering the light absorption and scattering loss by the conducting glass, the maximum efficiency for absorbed photon to current conversion efficiency is practically unity over this spectral range. As shown in Table 3, its short-circuit photocurrent density (Jsc), open-circuit photovoltage (Voc), and fill factor (ff) of device G with 54 dye under AM 1.5 full simulated sunlight are 12.0 mA·cm$^2$, 705 mV, and 0.72, respectively, yielding an overall conversion efficiency (η) of 6.1%.

Figure 16:
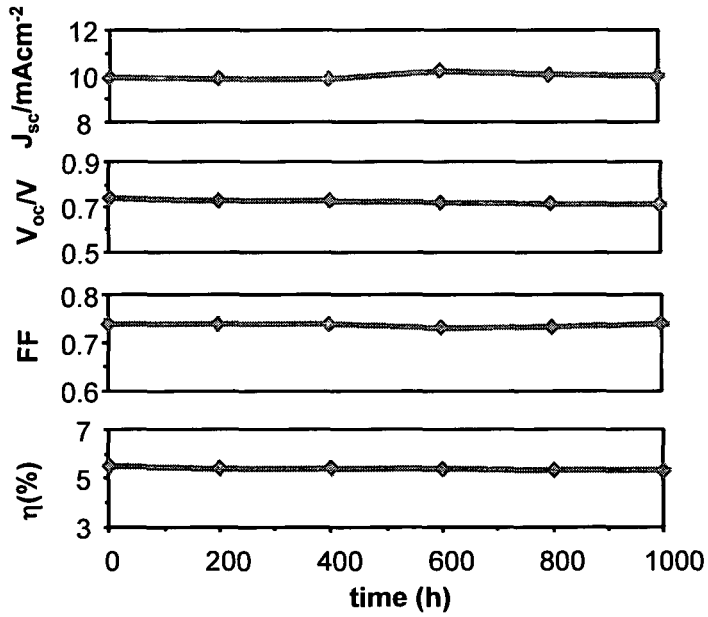
FIG. 16 shows photovoltaic parameters of device H using solvent free ionic liquid electrolyte during successive one sun visible-light soaking at 60° C.
Figure 17:
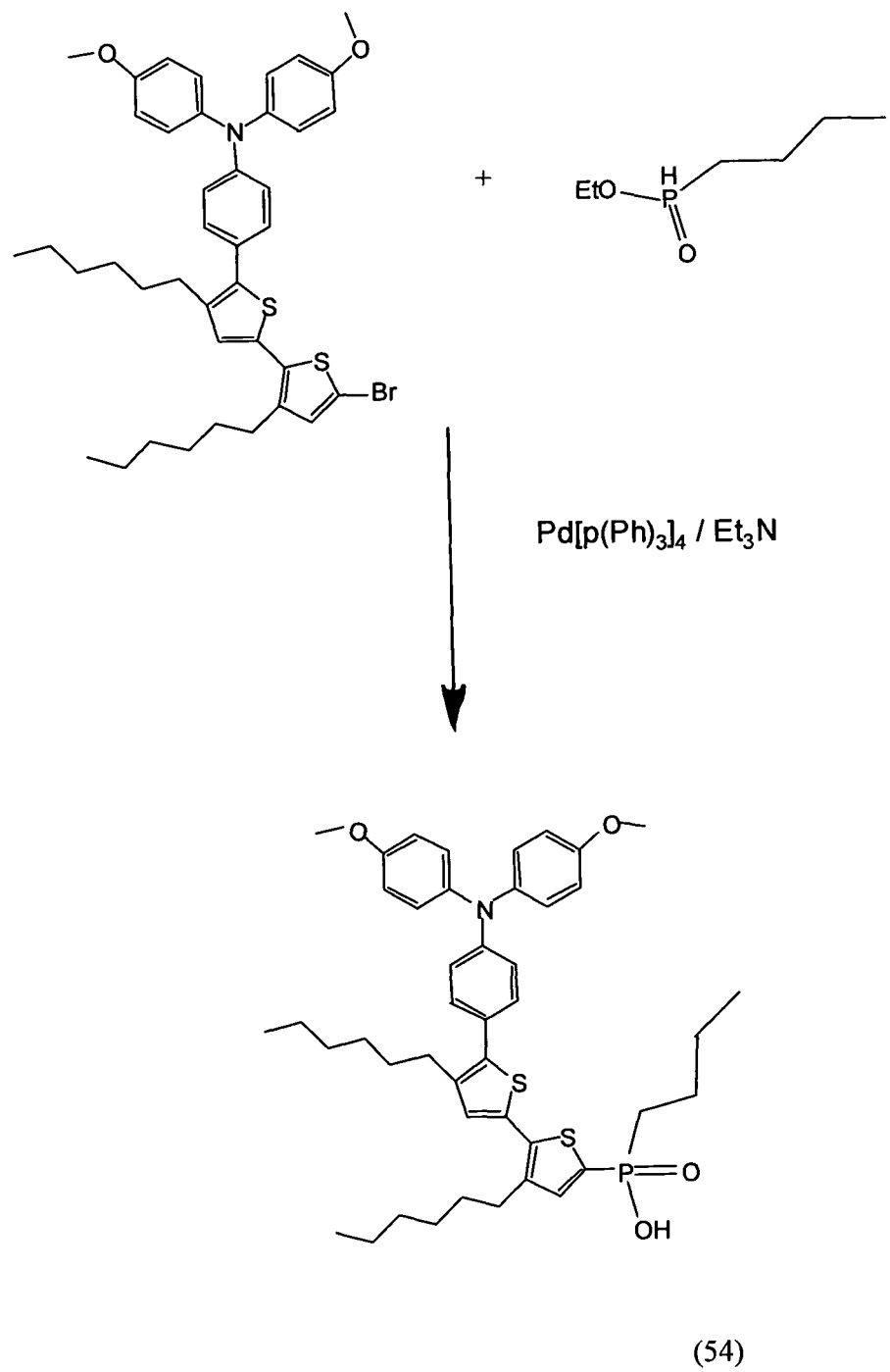
FIG. 17 shows the synthesis of 5'-(4-(bis(4-methoxyphenyl)amino)phenyl)-3,4'-dihexyl-2,2'-bithiophen-5-yl(butyl) phosphinic acid (compound 54).

The above-mentioned solvent free ionic liquid based electrolyte was used for the stability test of sensitizer 54 under thermal stress and visible light soaking. The advantage of using ionic liquid electrolyte lies in its high boiling point, non-volatility, non-toxicity and good photochemical stability, making it viable for practical application. Photovoltaic parameters (Jsc, Voc, ff, and η) of device H are 10.0 mA cm$^{-2}$, 710 mV, 0.74, and 5.2%, respectively. The cells covered with a 50 μm thick of polyester film (Preservation Equipment Ltd, UK) as a UV cut-off filter (up to 400 nm) were irradiated at open circuit under a Suntest CPS plus lamp (ATLAS GmbH, 100 mW·cm$^{-2}$, 55° C.). As shown in FIG. 16, all parameters of the device are rather stable during 1000 h accelerating test.

TABLE 3

Photovoltaic device parameters under AM 1.5 full sunlight illumination of device G and H using TiO$_2$ sensitized with 54 using volatile electrolyte and ionic liquid electrolytes.

| Device | Dye | $V_{OC}$ mV | $J_{SC}$ mA cm$^{-2}$ | F.F. ff | η (%) |
|---|---|---|---|---|---|
| G | 54 | 705 | 12.0 | 0.72 | 6.1 |
| H | 54 | 710 | 10.0 | 0.74 | 5.2 |

Overall Conclusion

In summary, we have indentified phosphinates as a new class of highly effective molecular insulators, which show great promise for improving the performance of devices, such as dye sensitized solar cells. Co-adsorption of the dineohexyl derivative (DINHOP) along with the amphiphilic ruthenium sensitizer Z907Na increased substantially the power output of the cells mainly due to the retardation of interfacial recombination of photo-generated charge carriers. The device based on a mixed Z907Na/DINHOP monolayer showed also outstanding stability under prolonged light soaking at 60° C., which is critical for outdoor applications of the DSCs. It was also shown that the phosphinic acid derivatives of the present invention have anticorrosive properties by blocking the surface.

Surprisingly, the phosphinic acid group strongly binds to the metal oxide surface and is thus generally suitable for modifying a wide range of surfaces.

The advantage of the compound of formula (1) is that two different chromophores are coupled on the same phosphorous atom of phosphinic acid to synthesize two dyes coupled together to have broad absorption spectra in the visible and near infra red region to harness the most of the solar energy. These two dyes could be both metal complexes, or one metal complex and one metal free dye, or both metal free dyes. The use of these types of panchromatic dyes will greatly improve the performance of the devices at the same time without impeding the durability.

The invention claimed is:

1. A device a dye-sensitized solar cell comprising a dye, an organic compound and a semiconductor photoanode, onto which the organic compound is co-adsorbed with the dye; and wherein the organic compound is a phosphinic acid compound of formula (1) below:

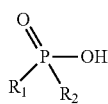

(1)

wherein $R_1$ and $R_2$ are independently selected from an organic substituent being a hydrocarbon comprising from 1-70 carbons and from 0-50 heteroatoms selected from halogens (F, I, Cl, Br), O, S, N, P, Se, As, and B, provided that $R_1$ or $R_2$ is not H.

2. The device of claim 1, wherein at least one of $R_1$ and $R_2$ is selected from alkyl, alkenyl, akynyl and aryl, all of which may comprise heteroatoms and may be further substituted by substituents being selected independently from alkyl, alkenyl, alkynyl, aryl, and amine, wherein all of said alkyl, alkenyl, alkynyl and aryl may comprise one or more heteroatoms, and wherein said amine may comprise one or more heteroatoms in addition to the nitrogen atom of the amine group, wherein all of said alkyl, alkenyl, alkynyl, aryl or amine substituents may be substituted independently by one or more further substituents selected from alkyl, alkenyl, alkynyl, and aryl, said alkyl, alkenyl, alkynyl, and aryl may optionally comprising one or more heteroatoms.

3. The device of claim 1, wherein at least one of $R_1$ and $R_2$ is selected from alkyl, alkenyl, and akynyl, which may be linear, cyclic and/or branched, comprise heteroatoms and be further substituted by substituents being selected independently from alkyl, alkenyl, alkynyl, aryl, and amine, wherein all of said alkyl, alkenyl, alkynyl and aryl may comprise one or more heteroatoms, and wherein said amine may comprise one or more heteroatoms in addition to the nitrogen atom of the amine group, wherein all of said alkyl, alkenyl, alkynyl, aryl or amine substituents may be substituted independently by one or more further substituents selected from alkyl, alkenyl, alkynyl, and aryl, said alkyl, alkenyl, alkynyl, and aryl may optionally comprising one or more heteroatoms.

4. The device of claim 1, wherein at least one of $R_1$ and $R_2$ is a substituted or unsubstituted aryl, or an alkyl, alkenyl, alkynyl substituted with a substituted or unsubstituted aryl, wherein said aryl may comprise one or more heteroatoms, and wherein substituents may be selected independently from alkyl, alkenyl, alkynyl, aryl, and amine, wherein all of said alkyl, alkenyl, alkynyl and aryl may comprise one or more heteroatoms, and wherein said amine may comprise one or more heteroatoms in addition to the nitrogen atom of the amine group, wherein all of said alkyl, alkenyl, alkynyl, aryl or amine substituents may be substituted independently by one or more further substituents selected from alkyl, alkenyl, alkynyl, and aryl, said alkyl, alkenyl, alkynyl, and aryl may optionally comprising one or more heteroatoms.

5. The device of claim 1, wherein at least one of $R_1$ and $R_2$ is an alkyl substituted with a substituted or unsubstituted aryl, wherein said aryl may comprise one or more heteroatoms, and wherein substituents $R_1$ and $R_2$ may be selected independently from alkyl, alkenyl, alkynyl, aryl, and amine, wherein all of said alkyl, alkenyl, alkynyl and aryl may comprise one or more heteroatoms, and wherein said amine may comprise one or more heteroatoms in addition to the nitrogen atom of the amine group, wherein all of said alkyl, alkenyl, alkynyl, aryl or amine substituents may be substituted independently by one or more further substituents selected from alkyl, alkenyl, alkynyl, and aryl, said alkyl, alkenyl, alkynyl, and aryl may optionally comprising one or more heteroatoms.

6. The device of claim 1, wherein the semiconductor photoanode comprises a semiconductor material selected from the group of Si, $TiO_2$, $SnO_2$, ZnO, $WO_3$, $Nb_2O_5$ and $TiSrO_3$.

7. The device of claim 1, wherein at least one of $R_1$ and $R_2$ comprises a system of conjugated double bonds selected from alkenyl, alkynyl, aryls and elkynyls.

8. The device of claim 1, wherein the co-adsorbed phosphinic acid derivative of formula (1) is attached by way of its phosphinate and/or phosphinic acid group onto the semiconductor surface.

* * * * *

UNITED STATES PATENT AND TRADEMARK OFFICE
CERTIFICATE OF CORRECTION

PATENT NO. : 8,847,065 B2
APPLICATION NO. : 13/138665
DATED : September 30, 2014
INVENTOR(S) : Zakeeruddin et al.

It is certified that error appears in the above-identified patent and that said Letters Patent is hereby corrected as shown below:

In the specification

Column 5, line 27: replace "TlAsS$_2$" with "TiAsS$_2$"

Column 14, lines 1-10, chemical formula (10): should be replaced with

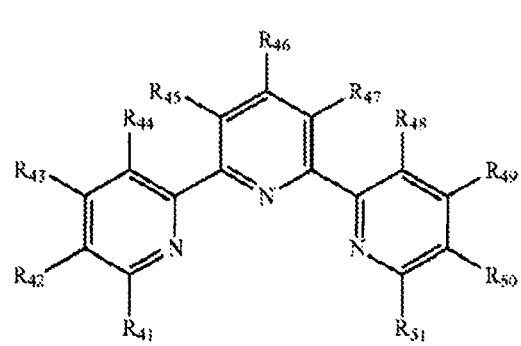

(10)

Signed and Sealed this
Twenty-first Day of April, 2015

Michelle K. Lee
*Director of the United States Patent and Trademark Office*